(12) United States Patent
Saha et al.

(10) Patent No.: US 7,283,915 B2
(45) Date of Patent: Oct. 16, 2007

(54) METHOD AND DEVICE OF FAULT LOCATION

(75) Inventors: Murair Saha, Västerås (SE); Eugeniusz Rosolowski, Wroclaw (PL); Jan Izykowski, Wroclaw (PL)

(73) Assignee: ABB AB, Västerås (SE)

( * ) Notice: Subject to any disclaimer, the term of this patent is extended or adjusted under 35 U.S.C. 154(b) by 823 days.

(21) Appl. No.: 10/450,646

(22) PCT Filed: Dec. 14, 2001

(86) PCT No.: PCT/SE01/02772

§ 371 (c)(1),
(2), (4) Date: Sep. 23, 2003

(87) PCT Pub. No.: WO02/48726

PCT Pub. Date: Jun. 20, 2002

(65) Prior Publication Data

US 2004/0167729 A1 Aug. 26, 2004

(30) Foreign Application Priority Data

Dec. 14, 2000 (SE) .................................. 0004626

(51) Int. Cl.
*G01R 31/00* (2006.01)
(52) U.S. Cl. ...................................... 702/59
(58) Field of Classification Search .................. 702/59, 702/58; 324/521, 522, 525, 772; 361/78
See application file for complete search history.

(56) References Cited

U.S. PATENT DOCUMENTS

| 4,559,491 A | * | 12/1985 | Saha ........................... 324/522 |
| 4,795,983 A | * | 1/1989 | Crockett et al. ............ 324/521 |
| 5,428,549 A | * | 6/1995 | Chen ........................... 702/59 |
| 5,455,776 A | | 10/1995 | Novosel |
| 5,786,708 A | * | 7/1998 | Premerlani et al. ......... 324/772 |
| 5,825,189 A | * | 10/1998 | Johns ......................... 324/525 |
| 5,929,642 A | * | 7/1999 | Philippot et al. ........... 324/522 |
| 6,097,280 A | | 8/2000 | Takeda et al. |
| 6,141,196 A | * | 10/2000 | Premerlani et al. ........... 361/78 |
| 6,148,267 A | * | 11/2000 | Premerlani ................... 702/58 |
| 6,584,417 B1 | * | 6/2003 | Hu et al. ..................... 702/58 |

\* cited by examiner

*Primary Examiner*—Carol S. W. Tsai
*Assistant Examiner*—Xiuqin Sun
(74) *Attorney, Agent, or Firm*—Venable LLP; Eric J. Franklin

(57) ABSTRACT

The present invention relates to a method for location of a fault utilizing unsynchronized measurements of three phase voltages and currents acquired at the line terminals without synchronization. Phasors for symmetrical components of the measured quantities are determined and used in the fault location algorithm. According to one embodiment, positive sequence phasors of post-fault quantities are used for estimation of the distance to fault and it is distinctive that such an estimation of a distance to fault is performed without essentially involving iterative techniques. In this embodiment, the fault location algorithm step is performed regardless of the fault type. In later steps, the type of fault may be obtained. According to another embodiment of the invention, at the occurrence of a fault, the type of fault is determined. If it is determined that it is not a three-phase balanced fault, negative sequence phasors are used for the estimation of the distance to fault. On the other hand, if it is a three-phase balanced fault, the incremental positive sequence phasors are used.

16 Claims, 8 Drawing Sheets

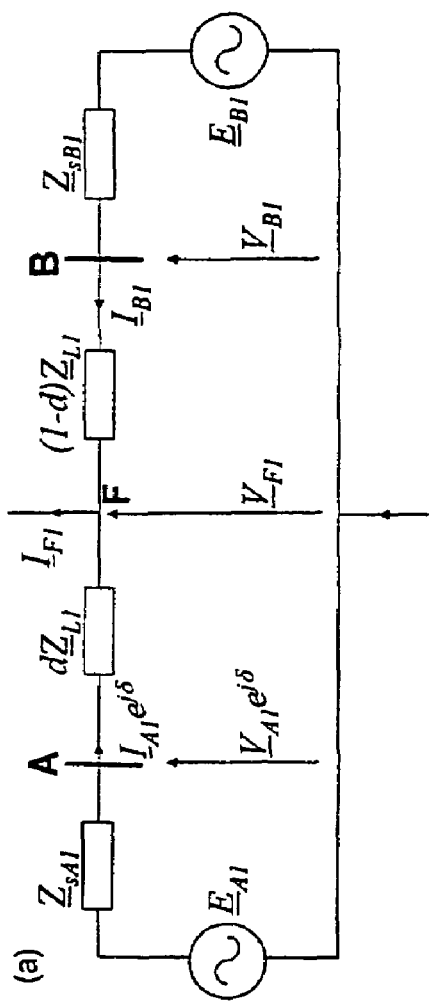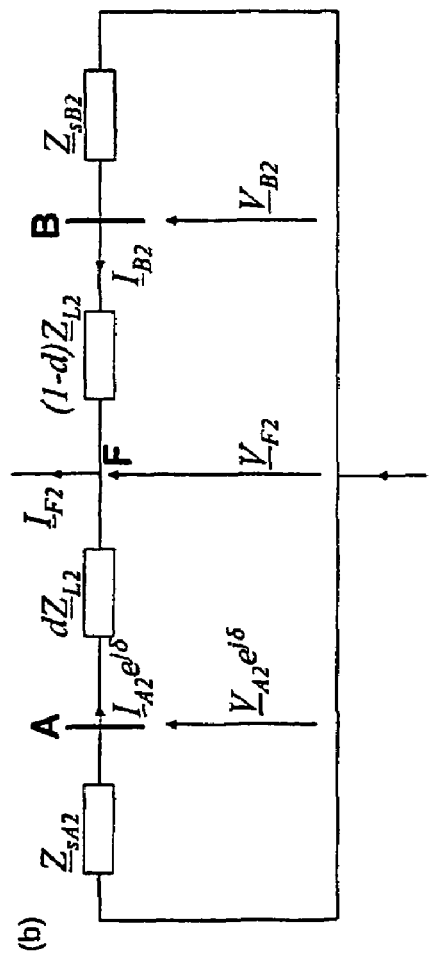
Fig. 1a
Fig. 1b

METHOD AND DEVICE OF FAULT LOCATION

TECHNICAL AREA

The present method of fault location, which is presented here, is based on utilizing unsynchronized measurements of three phase voltages and currents acquired at the line terminals without synchronization. Phasors for symmetrical components of the measured quantities are determined and used in the fault location algorithm. Basically, positive sequence phasors of post-fault quantities are used for estimation of the distance to fault and it is distinctive that such an estimation of a distance to fault is performed without involving iterative techniques.

BACKGROUND OF THE INVENTION

Several methods and approaches for fault location in high voltage power systems have been developed and tried. One approach has been to use voltage/current transducers located at terminals, between which the power lines to be monitored run.

One such system is disclosed in U.S. Pat. No. 5,455,776 where the transducers are connected to transducer blocks and a fault location estimation processor. The system uses positive or negative sequence networks.

Iterative calculations are used in U.S. Pat. No. 5,455,776 for determining the synchronization angle. In the disclosed method of U.S. Pat. No. 5,455,776, the unknown synchronization angle ($\delta$) is to be calculated by an iterative Newton-Raphson method and after this, the fault distance can be determined. The Newton-Raphson approach utilized in the method, starts from the initial guess for the synchronization angle set at a certain pre-defined value (usually equal to zero). As a result of iterative computations the nearest mathematical solution (which is the closest to the assumed initial guess) is reached. This approach seems to be reasonable for a majority of applications, as the other solution for the synchronization angle (which is mathematically possible but rejected here) is usually far away from the assumed initial guess and outside of the reasonable range. However, for some heavy fault cases (large difference of the detected instants of a fault occurrence performed at both line ends) there is a risk that the rejected solution is regarded as a correct result, while the reached solution is false.

BRIEF DESCRIPTION OF THE INVENTION

The object of the present invention is to provide a method for location of a fault utilizing unsynchronized measurements of three phase voltages and currents acquired at the line terminals without synchronization. Phasors for symmetrical components of the measured quantities are determined and used in the fault location algorithm. According to one embodiment, positive sequence phasors of post-fault quantities are used for estimation of the distance to fault and it is distinctive that such an estimation of a distance to fault is performed without essentially involving iterative techniques. In this embodiment, the fault location algorithm step is performed regardless of the fault type. In later steps, the type of fault may be obtained. According to another embodiment of the invention, at the occurrence of a fault, the type of fault is determined. If it is determined that it is not a three-phase balanced fault, negative sequence phasors are used for the estimation of the distance to fault. On the other hand, if it is a three-phase balanced fault, the incremental positive sequence phasors are used. The incremental positive sequence phasors are to be understood as the difference between the post-fault and the pre-fault values.

In addition, only for some—rather rare cases—the fault location algorithm directs into the two optional branches (A and B). This is done just for selection of the valid result for a distance to fault.

The first branch (A) is based on comparison of the values of the determined synchronization angle. The pre-fault measurements (A1) or post-fault measurements from the sound phases (A2) are utilized. As under three-phase balanced faults there are no sound phases, thus, when using the sub-branch (A2) for such faults, the impedance for the fault path is determined by taking the positive sequence phasors. The resistive character of this impedance indicates the valid solution, as it will be used also in the sub-branch (B1).

The other branch (B) requires distinguishing whether it is a three-phase balanced fault or the other unsymmetrical fault type. For three-phase balanced faults (B1) the impedance for the fault path is determined by taking the positive sequence phasors and the resistive character of this impedance indicates the valid solution. For the other types of fault (B2), the negative sequence quantities are used for estimation of a distance to fault.

In order to provide high accuracy of fault location the estimate initially obtained for the distance to fault undergoes refining by compensating for shunt capacitances of a line.

Since the zero sequence quantities are not involved in the presented algorithm the algorithm is applicable for locating faults in both a single line and parallel mutually coupled transmission lines.

The method according to the present invention differs substantially from the method introduced in U.S. Pat. No. 5,455,776. The synchronization angle ($\delta$), which relates the measurements from both line terminals to the common time base, is not involved here in the fault distance calculation itself. In fact, the synchronization angle is used in the presented fault location algorithm. However, it is used for the other purpose, namely for selecting the valid result for a distance to fault and is optional and not obligatory. In the algorithm according to the present invention the optional way of the selection, as A (A1 or A2) can be replaced by the way B (B1 together with B2), where the latter does not involve the synchronization angle.

The proposed method avoids the iterative calculations during the determination of the fault distance and at the same time considers all the mathematically possible solutions for the sought fault distance and in consequence of the synchronization angle. This guaranties that irrespective of parameters of the considered transmission network and the fault specifications the unique solution is always achieved. Thus, as for example, the algorithm can be adapted for locating faults in series-compensated lines, which are considered as extremely complex networks. Providing the unique solution is thus especially desired for such applications.

According to one embodiment, the fault location procedure starts with solving the quadratic equation involving positive sequence phasors only. This gives two solutions for the fault distance and only one of them corresponds to the actual value. The valid result in vast majority of the cases is directly obtained if only a single solution for the fault distance lies within a line length. While, in some rather very rare cases further selection of the valid result is required and no iterative calculations are applied for that too.

In case of three-phase symmetrical faults the original selection procedure is applied. This procedure selects the valid result by checking which the solution results in a lower imaginary part (ideally ought to be zero) of the estimated impedance for a fault path.

According to another embodiment, the first step is to determine the type of fault. After that, depending on the type of fault, either the quadratic equation involving negative sequence phasors is solved, or the quadratic equation involving incremental positive sequence phasors is solved.

According to an optional embodiment of the invention, improved accuracy of fault location may be obtained by introducing a calculation in which the shunt capacitances of a line are compensated for. This involves iterative calculations, however limited to a simple iteration calculation, in which a total of two iterations usually provides high accuracy. The compensation of shunt capacitances is an optional refinement of the algorithm and is performed at a late stage.

The present invention is applicable to transmission networks up to and over 400 kV as well as to distribution networks.

These and other aspects of the invention and its benefits will appear from the detailed description of the invention and from the accompanying drawings.

BRIEF DESCRIPTION OF THE DRAWINGS

In the following detailed description of the invention, reference will be made to the accompanying drawings, of which FIG. 1a. shows equivalent diagram of a two terminal line for the positive sequence, FIG. 1b shows equivalent diagram of a two terminal line for the negative sequence.

DETAILED DESCRIPTION OF THE INVENTION

Figure 2:
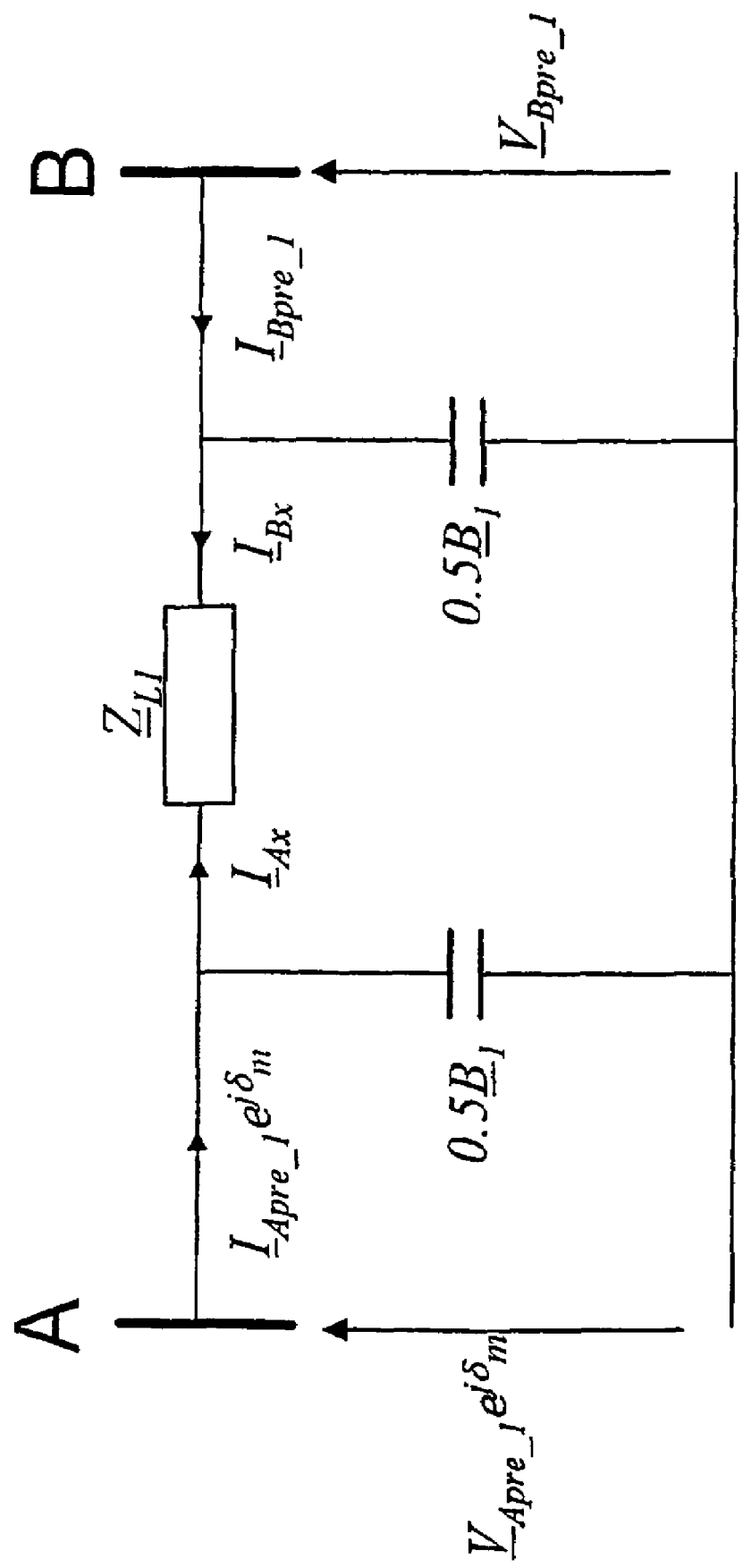
FIG. 2 shows the Π model of a line for the pre-fault positive sequence with including the shunt capacitances.

Characteristic of the Unsynchronized Measurements at the Line Terminals

It is considered that the measurements at the line terminals are performed without any synchronization. Thus, a fault occurrence instant is the only time relation between the measurement data from the line terminals. Physically, the actual fault occurrence instant (say, $t_0$) is the same for both ends data. However, in real life a fault can be detected by the fault detectors (contained in protective relays or fault locators at particular line ends) in certain instants (at the substation A: $t_A$ and at the substation B: $t_B$), which do not correspond to the actual inception instant ($t_0$). So, taking into account that in general:

$t_A \neq t_0$ $t_B \neq t_0$ $t_A \neq t_B$ one can expect that at both the ends the measurements from slightly shifted intervals can be frozen and used as the input data for the fault location algorithm. In some heavy cases (far end faults with high fault resistance) fault detection can be delayed even by few sampling intervals $T_s$ [say $(3 \div 4)T_s$], thus, for a typical sampling frequency equal to 1000 Hz, this corresponds to the angle: [$(54 \div 72)$deg]. At the same time at the opposite line terminal there could be no delay in fault detection at all or it could be very small—for example equal to a single $T_s$. Thus, the shift of the frozen intervals of the measurements at both the ends can correspond even to a few sampling intervals $T_s$. Moreover, this shift does not have to be equal to the multiple of the sampling period $T_s$ as, in general, the sampling instants at both the line ends do not coincide due to free running clocks which control the sampling at the line terminals.

The mentioned shift in time domain of the acquired samples of voltages and currents at the line terminals corresponds to the synchronization angle ($\delta$) when the phasors of the measured quantities are considered. The synchronization angle is to some extent a random quantity and only the possible range for it, located around zero (zero is for ideal synchronization), can be defined (assessed) for particular application. Thus, the synchronization angle is treated as the extra unknown of the fault location algorithm.

Basics of the Fault Location Algorithm

FIG. 1. presents equivalent diagrams of a single line for the positive (FIG. 1a) and for the negative sequence (FIG. 1b) quantities.

Impedance of a line for the negative sequence ($Z_{L2}$) is assumed in all further considerations (as in reality) as equal to the impedance for the positive sequence ($Z_{L1}$):

$$Z_{L2} = Z_{L1} \qquad (1)$$

Moreover, all the phasors in FIG. 1a, b are considered as related to the time basis of the phasors measured at the substation B ($V_{B1}$, $I_{B1}$, $V_{B2}$, $I_{B2}$), which are taken here as a reference. The measurements from the substations A and B are not synchronous and thus the measurements performed at the substation A are synchronized "artificially" to the measurements performed at the substation B, which are taken here as a reference. For this purpose the synchronization phase shift term ($e^{j\delta}$), where: $\delta$—unknown synchronization angle, is introduced. The synchronization phase shift term is included for both, the voltage and the current phasors from the substation A ($V_{A1}e^{j\delta}$, $I_{A1}e^{j\delta}$, $V_{A2}e^{j\delta}$, $I_{A2}e^{j\delta}$).

The equivalent circuit diagram for the positive sequence quantities (FIG. 1a) can be described with the following two equations:

$$V_{A1}e^{j\delta} - dZ_{L1}I_{A1}e^{j\delta} - V_{F1} = 0 \qquad (2)$$

$$V_{B1} - (1-d)Z_{L1}I_{B1} - V_{F1} = 0 \qquad (3)$$

where:

$V_{A1}$, $V_{B1}$—phasors of the positive sequence voltages measured at the substations A and B, respectively, $I_{A1}$, $I_{B1}$—phasors of the positive sequence currents measured at the substations A and B, respectively, $V_{F1}$—unknown phasor of the positive sequence component of the voltage drop across the fault path, $Z_{L1}$—impedance of the whole line for the positive sequence,
d—unknown distance to fault [pu], counted from the substation A,
δ—unknown synchronization angle.

By subtracting equations (2) and (3) one obtains equation (4) in which the unknown quantity $V_{F1}$ is eliminated and there are two unknowns—fault distance (d) and synchronization angle (δ):

$$V_{A1}e^{j\delta} - V_{B1} + Z_{L1}I_{B1} - dZ_{L1}(I_{A1}e^{j\delta} + I_{B1}) = 0 \quad (4)$$

The obtained equation (4) is considered for the phasors and thus can be resolved into its real and imaginary parts. In this way both the unknowns (d and δ) can be found.

The new approach according to the method of the present invention for solving equation (4), is to transfer it into the quadratic algebraic equation for the unknown fault distance (d). For this purpose one determines the term exp(jδ) expressed by the formula:

$$e^{j\delta} = \frac{\underline{V}_{B1} - Z_{L1}\underline{I}_{B1} + d Z_{L1}\underline{I}_{B1}}{\underline{V}_{A1} - d Z_{L1}\underline{I}_{A1}} \quad (5)$$

Calculation of absolute values for both the sides of (5) gives:

$$A_2 d^2 + A_1 d + A_0 = 0 \quad (6)$$

where:
d—unknown fault distance,
$A_2$, $A_1$, $A_0$—coefficients (real numbers) expressed duly with the unsynchronized measurements of the positive sequence phasors of voltages ($V_{A1}$, $V_{B1}$) and currents ($I_{A1}$, $I_{B1}$) at the line terminals and with the positive sequence impedance of a line ($Z_{L1}$):

$$A_2 = |Z_{L1}I_{A1}|^2 - |Z_{L1}I_{B1}|^2$$

$$A_1 = -2\text{real}\{V_{A1}(Z_{L1}I_{A1})^* + (V_{B1} - Z_{L1}I_{B1})(Z_{L1}I_{B1})^*\}$$

$$A_0 = |V_{A1}|^2 - |V_{B1} - Z_{L1}I_{B1}|^2 \quad (6a)$$

X* denotes conjugate of X, |X| denotes absolute value of X.

Complete derivation of equations (6)-(6a) is provided in APPENDIX 1.

Solution of the quadratic equation (6) with the coefficients defined in (6a) gives two solutions for a distance to fault ($d_1$, $d_2$):

$$d_1 = \frac{-A_1 - \sqrt{A_1^2 - 4A_2A_0}}{2A_2} \quad (6b)$$

$$d_2 = \frac{-A_1 + \sqrt{A_1^2 - 4A_2A_0}}{2A_2}$$

Figure 6:
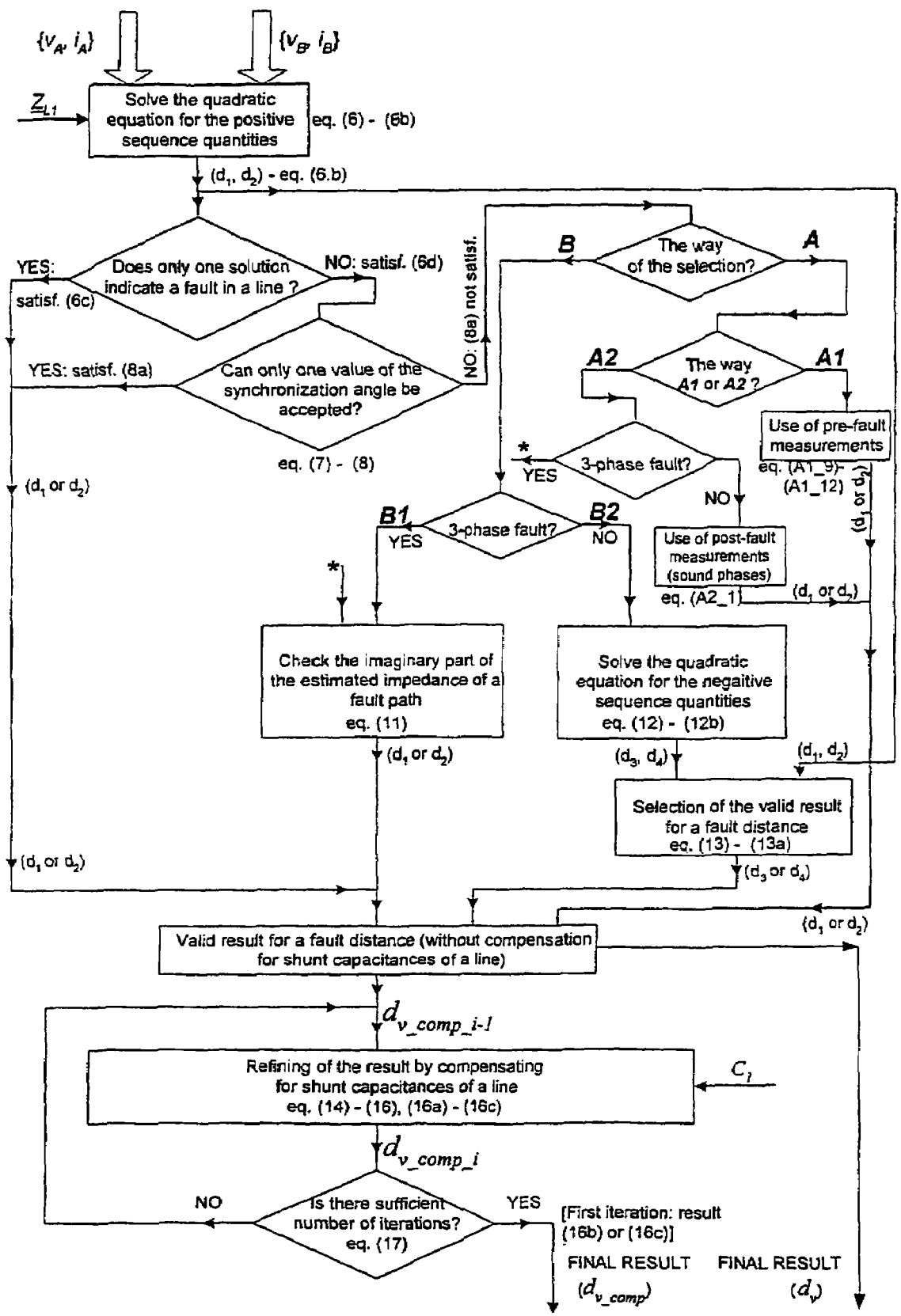
FIG. 6 shows a flow-chart of one example of a fault location algorithm according to the present invention.

Flow-chart of the complete fault location algorithm is presented in FIG. 6. According to this flow-chart the further steps are as follows.

If only one solution according to equation (6b) is within a line length:

$$0 < (d_1 \text{ or } d_2) < 1 \ pu \quad (6c)$$

then the value satisfying equation (6c) is taken as the valid result ($d_v$) while the other solution (indicating a fault as outside a line) is rejected.

In contrast, if both the results for a fault distance according to equation (6b) indicate a fault as in a line:

$$0 < (d_1 \text{ and } d_2) < 1 \ pu \quad (6d)$$

then the selection of the valid result is required to be performed.

The selection of the valid result is performed as follows. First, the values of the synchronization angle corresponding to both the solutions of equation (6b) are determined:

$$e^{j\delta_1} = \frac{\underline{V}_{B1} - Z_{L1}\underline{I}_{B1} + d_1 Z_{L1}\underline{I}_{B1}}{\underline{V}_{A1} - d_1 Z_{L1}\underline{I}_{A1}} \quad (7)$$

$$e^{j\delta_2} = \frac{\underline{V}_{B1} - Z_{L1}\underline{I}_{B1} + d_2 Z_{L1}\underline{I}_{B1}}{\underline{V}_{A1} - d_2 Z_{L1}\underline{I}_{A1}} \quad (8)$$

Generally, these values ($\delta_1$ and $\delta_2$) could lie in the whole mathematical range, which is considered when trigonometric relations are utilized—the range: $(-\pi \div \pi)$. However, for particular application this range can be considered as somehow reasonably shortened—to the certain range, which can be expected: $(-\delta_{short} \div \delta_{short})$. For example, assuming for this range:

$$(-\delta^{short} \div \delta_{short}) = (-\pi/2 \div \pi/2) \quad (8a)$$

will provide even certain safety margin. This is so, as the value of the angle, assumed in equation (8a) as equal to ($\pi/2$) is high enough. It corresponds to 4 sampling periods for a difference in fault detection instants at the line ends plus a single sampling period for having no synchronized clocks controlling sampling at both the line terminals (at 1000 Hz sampling frequency).

If only one value of the synchronization angle lies in the assumed range $(-\delta_{short} \div \delta_{short})$:

$$-\delta_{short} < (\delta_1 \text{ or } \delta_2) < \delta_{short} \quad (8a)$$

then, this value of the synchronization angle ($\delta_1$ or $\delta_2$) which satisfies equation (8a) indicates a valid solution for a distance to fault. Thus, when only the value ($\delta_1$) satisfies (8a), then the value of a distance to fault ($d_1$) is taken as the valid solution ($d_v = d_1$). Similarly, if the value ($\delta_2$) satisfies (8a) then the value of a distance to fault ($d_2$) is taken as the valid solution ($d_v = d_2$).

In contrast, if both the values of the synchronization angle lie in the assumed range $(-\delta_{short} \div \delta_{short})$, i.e.:

$$\delta_{short} < (\delta_1 \text{ and } \delta_2) < \delta_{short} \quad (8b)$$

further selection is required to be performed.

Further selection, if (8b) is satisfied, can be performed in the following two optional ways (A and B).

A: Comparison of the Calculated Values of the Synchronization Angles

A1: Comparison of the values of the synchronization angles (7), (8) corresponding to both the solutions (6b) with the value of the angle ($\delta_m$), which is determined with the pre-fault measurements of currents and voltages for the positive sequence.

The values for the shunt branches in the model of FIG. 2 are defined as follows: $B_1 = j\omega_1 C_1$, where: $C_1$ is the positive sequence shunt capacitance of the whole line.

Figure 3:
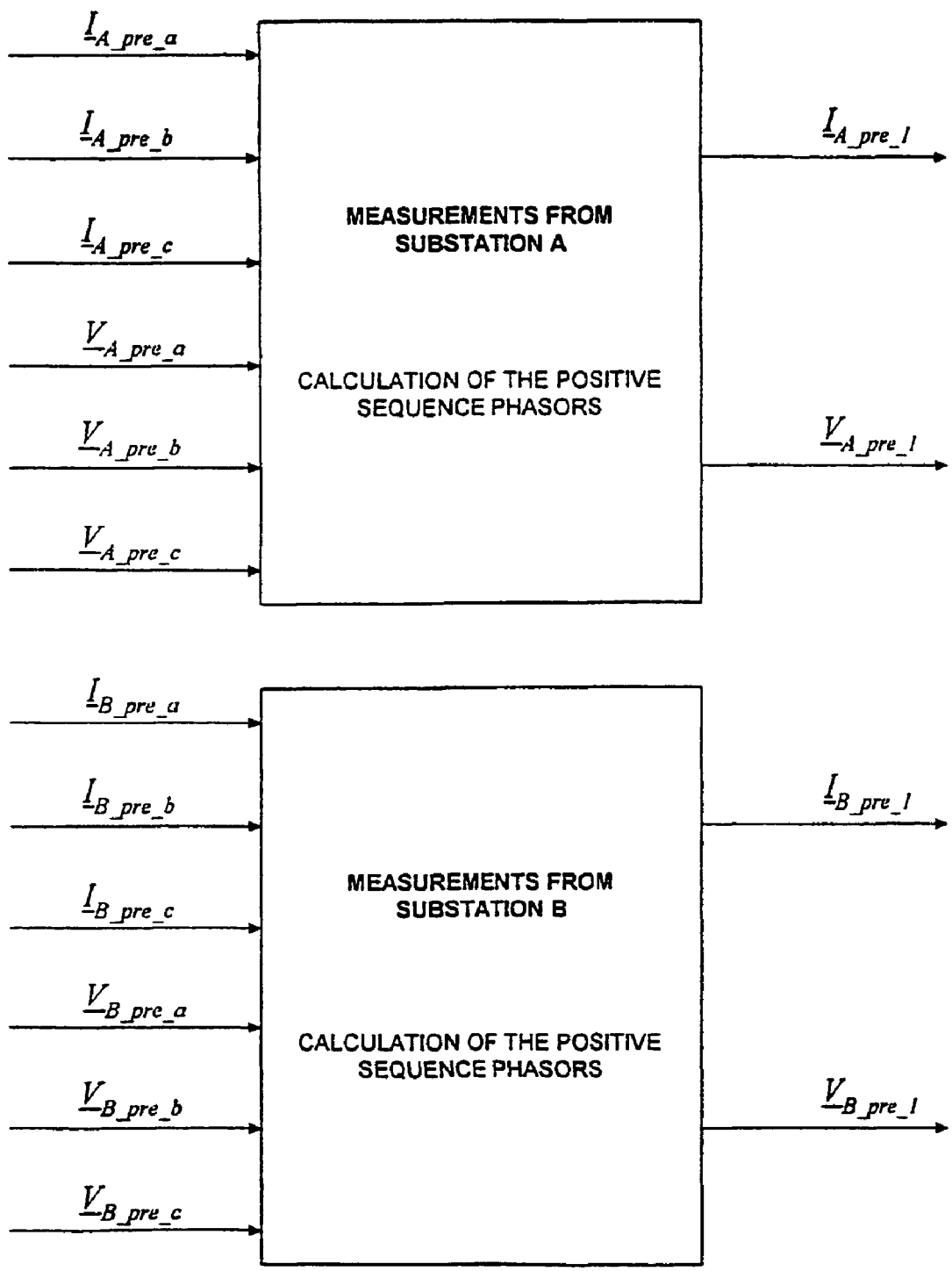
FIG. 3 shows determination of the positive sequence phasors for the pre-fault phase currents and voltages acquired at the substations A and B.

In order to determine the value of the synchronization angle ($\delta_m$) the computation starts from calculating positive sequence phasors of the pre-fault phase voltages and currents acquired at the substations A and B (FIG. 3). For example, taking the pre-fault currents from phases (a, b, c) at the station A ($I_{A\_pre\_a}$, $I_{A\_pre\_b}$, $I_{A\_pre\_c}$) the positive sequence phasor ($I_{A\_pre\_1}$) is calculated. Analogously, the positive sequence phasor ($V_{A\_pre\_1}$) is calculated from the pre-fault phase voltages from the station A. The same processing is for the pre-fault phase currents and voltages from the substation B (FIG. 3).

The value of the synchronization angle ($\delta_m$) is calculated from the following condition for the circuit of FIG. 2:

$$I_{Ax} = -I_{Bx} \qquad (A1\_1)$$

where:

$I_{Ax} = I_{A\_pre\_1} e^{j\delta_m} - j0.5\omega_1 C_1 V_{A\_pre\_1} e^{j\delta_m}$
$I_{Bx} = I_{B\_pre\_1} - j0.5\omega_1 C_1 V_{B\_pre\_1}$ After some rearrangements, the formula (A1_1) leads to the following formula for the synchronization angle ($\delta_m$):

$$\delta_m = \text{angle}(P + jQ) = \tan^{-1}\left(\frac{N_2 D_1 - N_1 D_2}{N_1 D_1 + N_2 D_2}\right) \qquad (A1\_9)$$

where:

$N_1 = -\text{real}(I_{B\_pre\_1}) - 0.5\omega_1 C_1 \text{imag}(V_{B\_pre\_1})$
$N_2 = -\text{imag}(I_{B\_pre\_1}) + 0.5\omega_1 C_1 \text{real}(V_{B\_pre\_1})$
$D_1 = \text{real}(I_{A\_pre\_1}) + 0.5\omega_1 C_1 \text{imag}(V_{A\_pre\_1})$
$D_2 = \text{imag}(I_{A\_pre\_1}) - 0.5\omega_1 C_1 \text{real}(V_{A\_pre\_1})$ Complete derivation of (A1_9) is provided in APPENDIX 2.

The value of the synchronization angle $\delta_m$ (calculated in equation (A1_9)) is compared with the values of the synchronization angle ($\delta_1$, $\delta_2$), introduced in equations (7)-(8) and calculated:

$$\delta_1 = \text{angle}\left(\frac{V_{BI} - Z_{LI}I_{BI} + d_1 Z_{LI}I_{BI}}{V_{AI} - d_1 Z_{LI}I_{AI}}\right) \qquad (A1\_10)$$
$$= \text{angle}(P_1 + jQ_1)$$
$$= \tan^{-1}\left(\frac{Q_1}{P_1}\right)$$

where:

$$P_1 = \text{real}\left(\frac{V_{BI} - Z_{LI}I_{BI} + d_1 Z_{LI}I_{BI}}{V_{AI} - d_1 Z_{LI}I_{AI}}\right) \qquad (A1\_11)$$
$$Q_1 = \text{imag}\left(\frac{V_{BI} - Z_{LI}I_{BI} + d_1 Z_{LI}I_{BI}}{V_{AI} - d_1 Z_{LI}I_{AI}}\right)$$

and $$\delta_2 = \text{angle}\left(\frac{V_{BI} - Z_{LI}I_{BI} + d_2 Z_{LI}I_{BI}}{V_{AI} - d_2 Z_{LI}I_{AI}}\right)$$
$$= \text{angle}(P_2 + jQ_2)$$
$$= \tan^{-1}\left(\frac{Q_2}{P_2}\right)$$

where:

$$P_2 = \text{real}\left(\frac{V_{BI} - Z_{LI}I_{BI} + d_2 Z_{LI}I_{BI}}{V_{AI} - d_2 Z_{LI}I_{AI}}\right)$$

-continued
$$Q_2 = \text{imag}\left(\frac{V_{BI} - Z_{LI}I_{BI} + d_2 Z_{LI}I_{BI}}{V_{AI} - d_2 Z_{LI}I_{AI}}\right)$$

The selection of the valid result ($d_v$) from the solutions of the quadratic equation (6) for the fault distance [($d_1$ or $d_2$)—eq. (6b)] is performed as follows:

if $|\delta_2 - \delta_m| > |\delta_1 - \delta_m|$ then $d_v = d_1$ else $d_v = d_2$ end $\qquad (A1\_12)$ A2: Comparison of the values of the synchronization angles (A1_10)-(A1_11), corresponding to both the solutions (6b) with the value of the angle ($\delta_{sound}$), which is determined with the post-fault measurements of currents and voltages taken from the sound phase.

The procedure is analogous as in the section A1 but instead of the positive sequence phasors of the pre-fault quantities the phasors for the particular sound phase voltage and current are utilized.

First, it ought to be checked whether there is any sound phase. For three phase balanced faults there is no sound phase and for such a case the procedure based on checking the imaginary part of the estimated fault path impedance is utilized (this procedure will be considered in the next parts of this document—the branch B1 in the flow-chart (FIG. 6)).

For example if the a-g fault occurs then the quantities from the phase b or from the phase c can be utilized. Taking the phase quantities from a particular sound phase the value of the synchronization angle ($\delta_{sound}$) is determined (analogously as it is shown for determining the value of the synchronization angle $\delta_m$—equation (A1_9)).

The selection of the valid result ($d_v$) from the solutions of the quadratic equation (6) for the fault distance ($d_1$ or $d_2$), calculated in (6b), is performed as follows:

if $|\delta_2 - \delta_{sound}| > |\delta_1 - \delta_{sound}|$ then $d_v = d_1$ else $d_v = d_2$ end $\qquad (A2\_1)$ where:

$\delta_1$, $\delta_2$—the values of the synchronization angle calculated in equation (A1_10)-(A1_11).

B. Analytically, Without Considering the Synchronization Angle

B1: For three-phase balanced faults—by considering the impedance of a fault path, estimated by taking the positive sequence measured quantities. The values of the fault path impedance [$Z_{F1}(d_1)$ and $Z_{F2}(d_2)$], corresponding to both the solutions of the equation (6) for distance to a fault ($d_1$, $d_2$), are calculated. For real faults the fault path impedance is resistive. Thus, this impedance [$Z_{F1}(d_1)$ or $Z_{F2}(d_2)$], which has smaller imaginary part (ideally equal to zero), indicates the valid solution for a distance to fault ($d_1$ or $d_2$), calculated in (6b).

Figure 4:
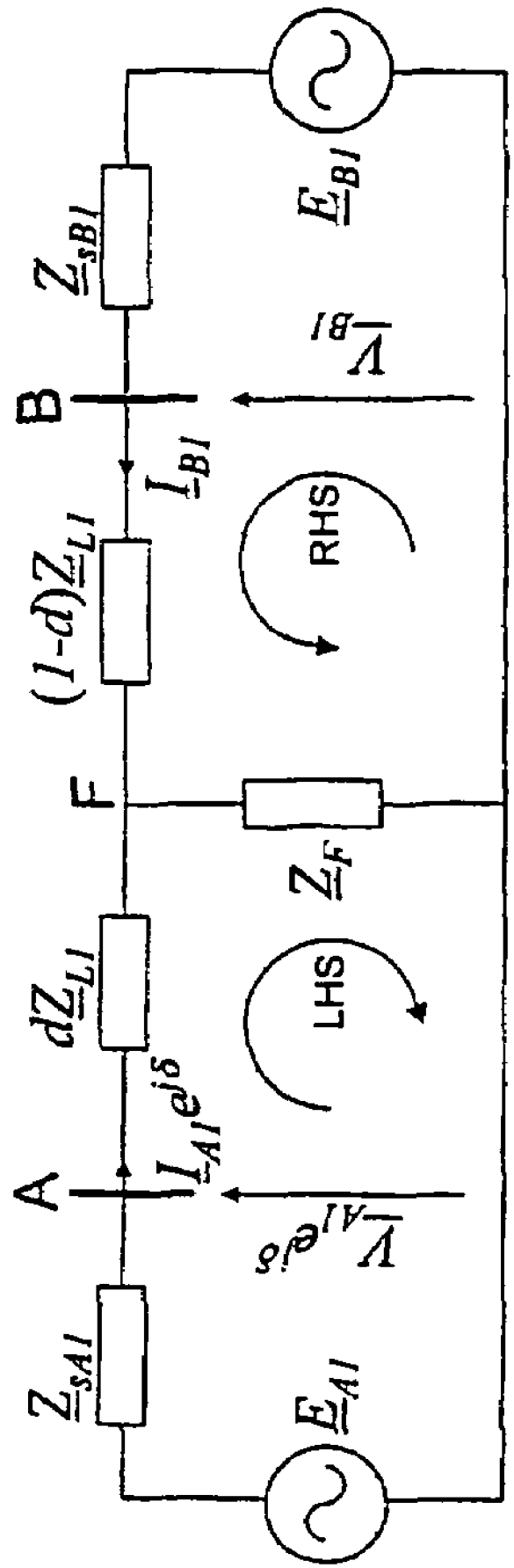
FIG. 4 shows an equivalent circuit diagram for a transmission line affected by a three-phase symmetrical fault.

Definition of the fault path impedance under balanced three-phase faults follows. FIG. 4 presents equivalent diagram used for that.

In the circuit of FIG. 4 (a three-phase fault on a line) the positive sequence components of currents and voltages are the only components, which are present in the signals. For real faults the fault path impedance is composed of a fault resistance only: $Z_F = R_F$. The selection procedure of the valid solution is based on checking which of the estimated fault path impedances $[Z_{F1}(d_1)$ or $Z_{F2}(d_2)]$ is closer to the condition $Z_F = R_F$.

Taking the left-hand side loop (LHS) in the circuit of FIG. 4 the following voltage formula can be written down:

$$V_{A1}e^{j\delta} - dZ_{L1}I_{A1}e^{j\delta} - Z_F(I_{A1}e^{j\delta} + I_{B1}) = 0 \quad (a)$$

The values of the fault path impedance are calculated as:

$$Z_{F1}(d_1) = P_2 d_1^2 + P_1 d_1 + P_0 \quad (9)$$

$$Z_{F2}(d_2) = P_2 d_2^2 + P_1 d_2 + P_0 \quad (10)$$

where:

$$P_2 = \frac{-Z_{L1}^2 I_{A1} I_{B1}}{I_{A1} V_{B1} + I_{B1} V_{A1} - Z_{L1} I_{A1} I_{B1}}$$

$$P_1 = \frac{Z_{L1} I_{B1} V_{A1} - Z_{L1} I_{A1} V_{B1} + Z_{L1}^2 I_{A1} I_{B1}}{I_{A1} V_{B1} + I_{B1} V_{A1} - Z_{L1} I_{A1} I_{B1}}$$

$$P_0 = \frac{V_{A1} V_{B1} - Z_{L1} I_{B1} V_{A1}}{I_{A1} V_{B1} + I_{B1} V_{A1} - Z_{L1} I_{A1} I_{B1}}$$

Complete derivation of equations (9)-(10) is provided in APPENDIX 3.

The impedance (equations (9) or (10)), that has smaller imaginary part (ideally equal to zero), indicates the valid solution. The selection of the valid result ($d_v$) from the solutions of the quadratic equation (6) for the fault distance ($d_1$ or $d_2$) is performed as follows:

if $|\text{imag}(Z_{F1}(d_1))| < |\text{imag}(Z_{F2}(d_2))|$ then $d_v = d_1$ else $d_v = d_2$ end (11)

Note: The criterion for selection of the valid result based on checking the imaginary part of the fault path impedance, estimated with use of the positive sequence post-fault quantities (11) is novel.

B2: For the other fault types (all faults except the balanced three-phase faults) the quadratic equation stated for negative sequence quantities is utilized.

With Reference to FIG. 1b (equivalent circuit diagram for the negative sequence) and proceeding analogously, as it has been done for deriving the quadratic equation for the positive sequence (6), one obtains the quadratic equation for the sought fault distance (d) as:

$$B_2 d^2 + B_1 d + B_0 = 0 \quad (12)$$

where: $B_2$, $B_1$, $B_0$ are the real number coefficients expressed analogously as the coefficients of (6), but with use of the negative sequence quantities:

$$B_2 = |Z_{L1} I_{A2}|^2 - |Z_{L1} I_{B2}|^2$$

$$B_1 = -2\text{real}\{V_{A2}(Z_{L1}I_{A2})^* + (V_{B2} - Z_{L1}I_{B2})(Z_{L1}I_{B2})^*\}$$

$$B_0 = |V_{A2}|^2 - |V_{B2} - Z_{L1} I_{B2}|^2 \quad (12a)$$

By solving equation (12), taking into account equation (12a), the next two solutions for the fault distance ($d_3$, $d_4$) are obtained:

$$d_3 = \frac{-B_1 - \sqrt{B_1^2 - 4B_2 B_0}}{2B_2} \quad (12b)$$

$$d_4 = \frac{-B_1 + \sqrt{B_1^2 - 4B_2 B_0}}{2B_2}$$

The solutions, taken out of all four solutions ($d_1$, $d_2$, $d_3$, $d_4$), which coincide ($d_i = d_j$, where: i=1 or 2, j=3 or 4) indicate the valid solution for the fault distance ($d_v$). In practice, there are some errors in fault distance estimation (as for example, shunt capacitances of a line are not taken into account at this stage of the fault location algorithm) and instead of the ideal condition $d_i = d_j$ the following can be applied:

$$|d_i - d_j| = \min \quad (13)$$

where: i=1 or 2, j=3 or 4

As a result of the selection criterion (13) the valid result is obtained as:

$$d_v = d_j \quad (13a)$$

Note: The solution ($d_j$)—obtained by solving the quadratic equation for the negative sequence quantities, and not the solution ($d_i$)—obtained by solving the quadratic equation for the positive sequence quantities, is taken as the valid result (13a). This is so, as neglecting shunt capacitances of a line influences stronger the accuracy of fault location (there are larger errors), when performed with the positive sequence quantities than with the negative sequence quantities.

According to an optional embodiment the fault location accuracy may be refined by finally compensating for shunt capacitances of a line. The compensation procedure is iterative and ends if the consecutive results for the distance to a fault differ by less than the set margin for the convergence.

First iteration of the compensation (subscript: comp_1) is described below.

Figure 5:
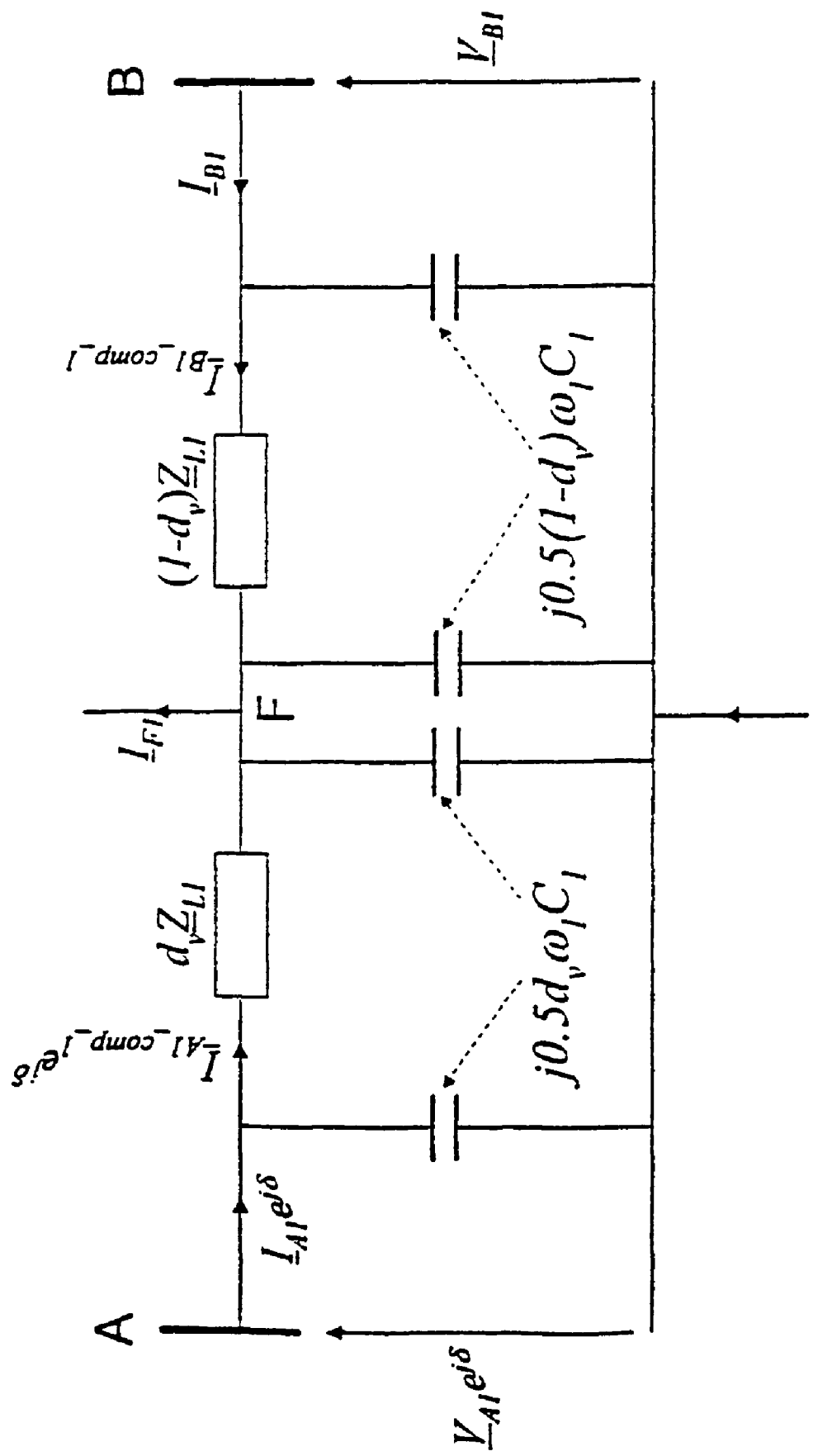
FIG. 5 shows an equivalent circuit diagram (positive sequence) for the first iteration of the compensation for shunt capacitances of a line.

In the compensation procedure the phasors of currents are compensated for line shunt capacitances while the original phasors for the voltage signals are applied. Referring to FIG. 5, the compensation for the positive sequence currents is performed according to:

$$I_{A1\_comp\_1} = I_{A1} - j0.5\omega_1 C_1 d_v V_{A1} \quad (14)$$

$$I_{B1\_comp\_1} = I_{B1} - j0.5\omega_1 C_1 (1 - d_v) V_{B1} \quad (15)$$

where:

$d_v$—fault distance (the valid result) obtained without taking into account the shunt capacitances of a line, $C_1$—shunt capacitance of a whole line.

Taking the phasors compensated for shunt capacitances ((14)-(15)) the quadratic algebraic equation for a fault distance before the compensation (6) transforms to the following quadratic algebraic equation for the improved fault distance:

$$A_{2\_comp\_1} d^2_{comp\_1} + A_{1\_comp\_1} d_{comp\_1} + A_{0\_comp\_1} = 0 \quad (16)$$

where:

$d_{comp\_1}$—the improved fault distance result (result of the first iteration of the compensation), $A_{2\_comp\_1}$, $A_{1\_comp\_1}$, $A_{0\_comp\_1}$—coefficients (real numbers) expressed duly with the unsynchronized measurements at the line terminals and with the positive sequence impedance of a line ($Z_{L1}$). The following measurements are used: the original positive sequence phasors of voltages ($V_{A1}$, $V_{B1}$) and the phasors of currents compensated for a line shunt capacitances ($I_{A1\_comp\_1}$, $I_{B1\_comp\_1}$):

$$A_{2\_comp\_1} = |Z_{L1}I_{A1\_comp\_1}|^2 - |Z_{L1}I_{B1\_comp\_1}|^2$$

$$A_{1\_comp\_1} = -2\text{real}\{V_{A1}(Z_{L1}I_{A1\_comp\_1})^* + (V_{B1} - Z_{L1}I_{B1\_comp\_1})(Z_{L1}I_{B1\_comp\_1})^*\}$$

$$A_{0\_comp\_1} = |V_{A1}|^2 - |V_{B1} - Z_{L1}I_{B1\_comp\_1}|^2 \tag{16a}$$

By solving equation (16), and taking (16a), the two solutions for the fault distance ($d_{comp\_1A}$, $d_{comp\_1B}$) are obtained:

$$d_{comp\_1A} = \frac{-A_{1\_comp\_1} - \sqrt{A_{1\_comp\_1}^2 - 4A_{2\_comp\_1}A_{0\_comp\_1}}}{2A_{2\_comp\_1}} \tag{16b}$$

$$d_{comp\_1B} = \frac{-A_{1\_comp\_1} + \sqrt{A_{1\_comp\_1}^2 - 4A_{2\_comp\_1}A_{0\_comp\_1}}}{2A_{2\_comp\_1}} \tag{16c}$$

As a result of the first iteration of the compensation the improved value for the fault distance is obtained ($d_{v\_comp\_1}$). Selection of one particular solution from equations (16b) or (16c), is straightforward. If before the compensation the solution $d_1$ was selected as the valid result ($d_v = d_1$), then we take $d_{comp\_1A}$ as the valid result after the first iteration of the compensation ($d_{v\_comp\_1} = d_{comp\_1A}$). Similarly, if, before the compensation the solution $d_2$ was selected as the valid result ($d_v = d_2$) then we take $d_{comp\_1B}$ as the valid result after the first iteration of the compensation ($d_{v\_comp\_1} = d_{comp\_1B}$).

Next iterations of the compensation are performed analogously. The value of a distance to fault calculated in a particular iteration (say $n^{th}$ iteration): ($d_{v\_comp\_n}$) is taken for compensation of the phasors of the currents for shunt capacitances (like in equations (14)-(15)) and after to be introduced in the next iteration (($n+1)^{th}$ iteration).

The iterations are continued until the convergence with the pre-defined margin ($d_{margin}$) is achieved:

$$|d_{v\_comp\_i} - d_{v\_comp\_i-1}| < d_{margin} \tag{17}$$

where:
the index (i) stands for the present iteration while the index (i−1) for the preceding iteration.

Figure 7:
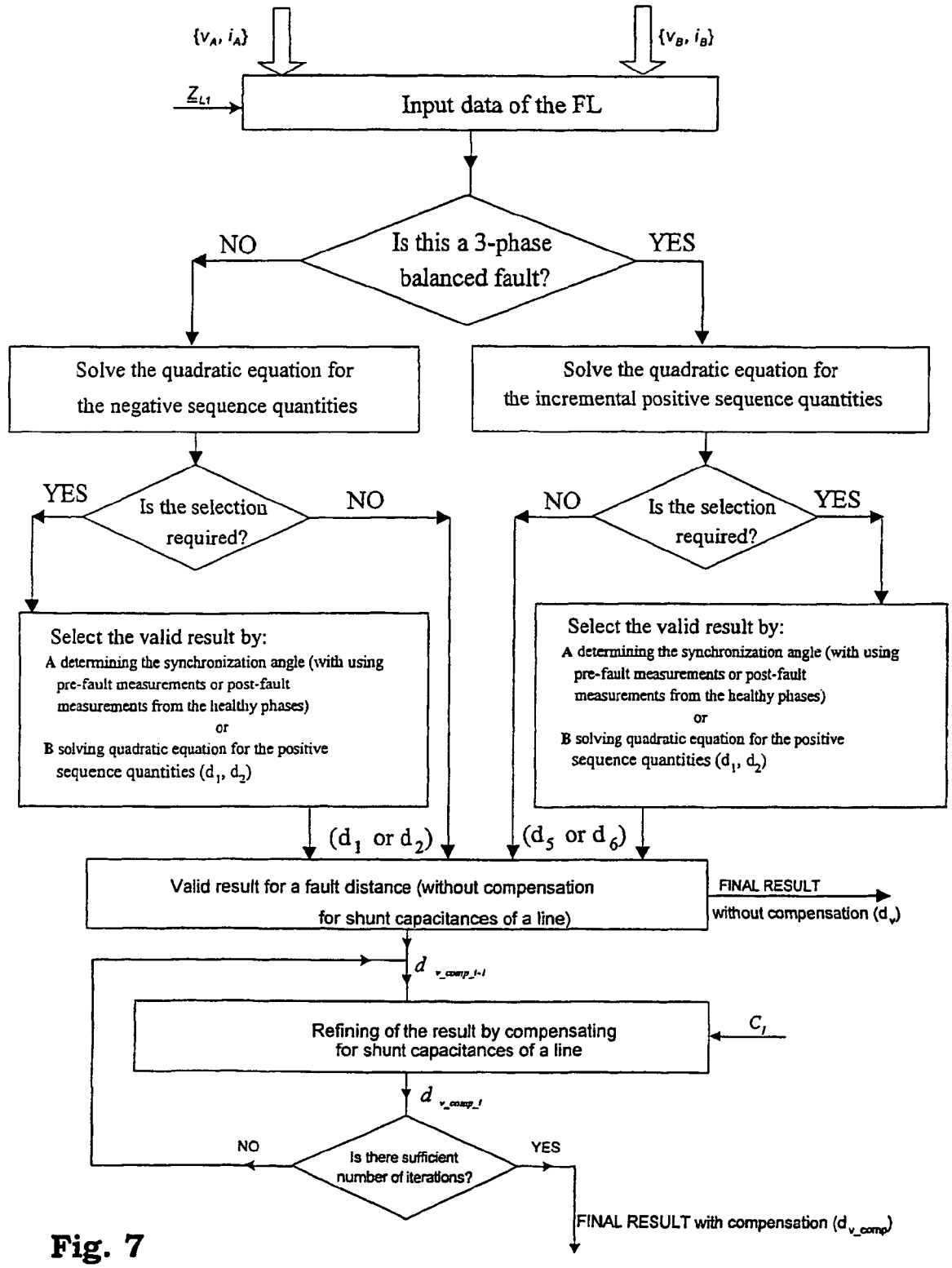
FIG. 7 shows a flow-chart of another example of a fault location algorithm according to the present invention.
Figure 8:
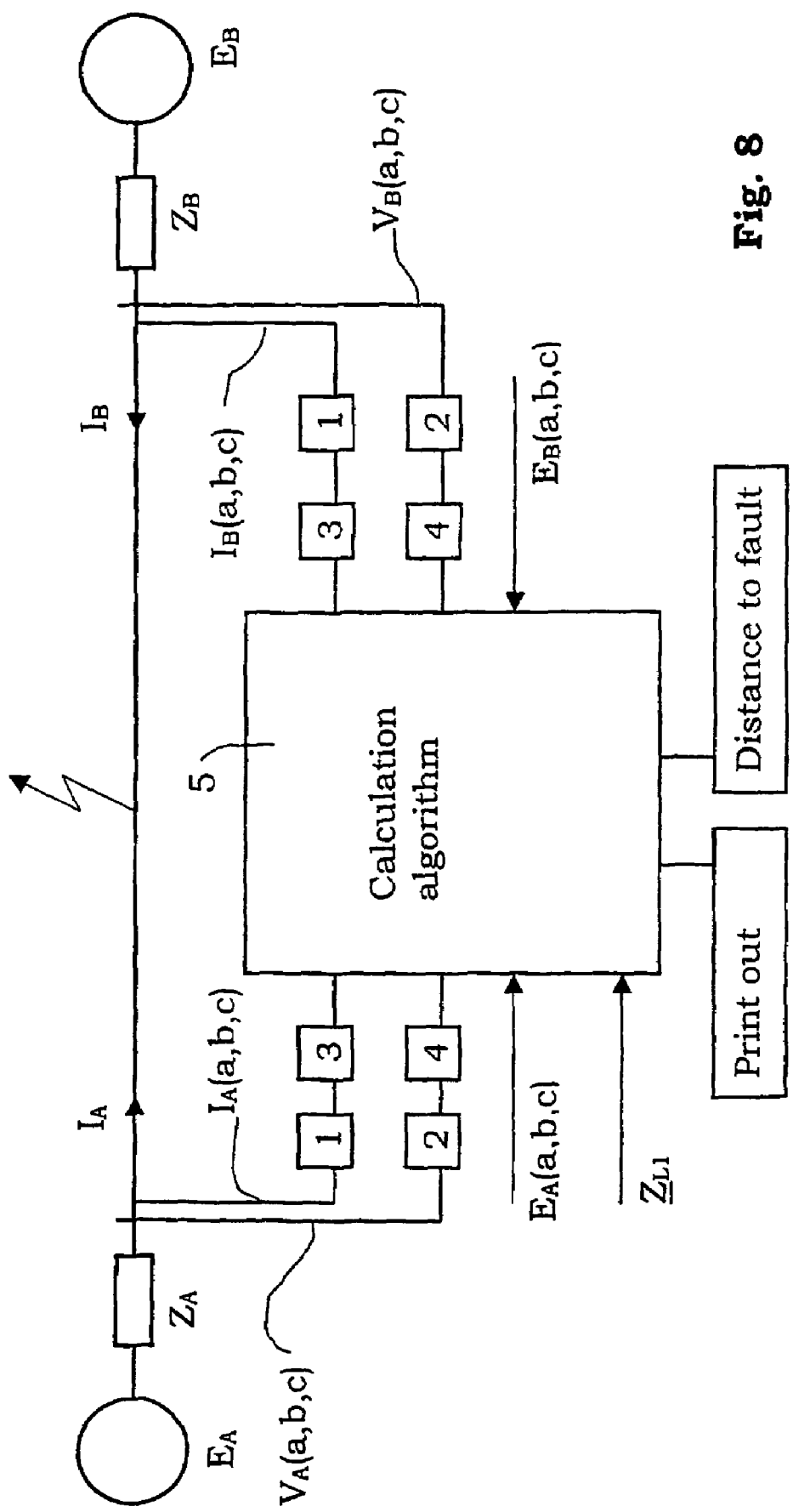
FIG. 8 shows an example of a device and system for carrying out the method.

Solving the quadratic algebraic equation (6) for the unknown fault distance (d) is the first step of the sequence of computations in the fault location algorithm presented in FIG. 6. This step is performed regardless the fault type. Information on the fault type—in terms: whether it is the three-phase balanced fault or any other fault—could be required in the next steps. An alternative way of computations, as shown in FIG. 7, is based on utilizing the above mentioned information on the fault type (whether it is the three-phase balanced fault or any other fault) at the very beginning of the calculation algorithm.

In the alternative algorithm, the calculation algorithm branches into two different paths, which are used depending upon what type of a fault has been recognized.

In case of all faults apart from three-phase balanced faults, the unknown fault distance is calculated by solving the quadratic algebraic equation (12). This gives two solutions for a distance to fault ($d_3$, $d_4$) as in equation (12b). If only one solution according to equation (12b) is within a line length then this value is taken as the valid result ($d_v$).

Otherwise (both solutions from equation (12b) are within a line length), the selection of the valid solution ($d_3$ or $d_4$) is required. This selection can be performed in two optional ways:

The first way of the selection (A) is based on determining the values of the synchronization angle, as it is defined in equations (7) and (8), but in this case the values correspond to the solutions ($d_3$, $d_4$). Firstly, satisfying of the condition of equation (8a) has to be checked. If equation (8a) is satisfied, then the solution that satisfies equation (8a) is taken as the valid. In contrast (when equation (8b) is satisfied), the other two optional procedures of the selection, described in the sections A1 and A2 above, have to be applied.

The second way of the selection (B) is based on solving the quadratic algebraic equation for the positive sequence quantities (6). This gives two solutions for a distance to fault ($d_1$, $d_2$), which are calculated according to equation (6b). The solutions, taken out of all four solutions ($d_1$, $d_2$, $d_3$, $d_4$), which coincide ($d_i = d_j$, where: i=1 or 2, j=3 or 4) indicate the valid solution for the fault distance ($d_v$). This is performed by using equations (13) and (13a).

In case of three-phase balanced faults, the unknown fault distance is calculated by solving the quadratic algebraic equation, which is formulated for the incremental positive sequence quantities. The particular incremental positive sequence component is understood as the difference between the post-fault and the pre-fault values.

Proceeding analogously, as it has been done for deriving equation (6), derives the quadratic equation for the incremental positive sequence quantities. The positive sequence quantities from equation (6) are replaced by the corresponding incremental positive sequence quantities. Solution of such obtained quadratic algebraic equation provides two solutions for a distance to fault ($d_5$, $d_6$), calculated analogously as in equation (6b). If only one solution ($d_5$ or $d_6$) is within a line then this solution is taken as the valid solution ($d_v$). Otherwise (both solutions ($d_5$ and $d_6$) are within a line length), the selection of the valid solution ($d_5$ or $d_6$) is required. This selection can be performed in the analogous ways, as applied for the case of all faults, but with exception of three-phase symmetrical faults. The replacing of the solutions $d_3$, $d_4$ by the solutions $d_5$, $d_6$ is required for that.

According to the embodiment the fault location accuracy may be refined by finally compensating for shunt capacitances of a line. The compensation procedure is as described by equations (14)-(17).

FIG. 7 shows an embodiment of a device for determining the distance from a station, at one end of a transmission line, until the occurrence of a fault on the transmission line according to the described method, comprising certain measuring devices, measurement value converters, members for treatment of the calculating algorithms of the method, indicating means for the calculated distance to fault and a printer for printout of the calculated fault.

In the embodiment shown, measuring devices 1 and 2 for continuous measurement of all the phase currents from the faulty line and phase voltages are arranged in both stations A and B. In the measurement converters 3 and 4, a number of these consecutively measured values, which in case of a fault are passed to a calculating unit 5, are filtered and stored. The calculating unit is provided with the calculating algorithms described, programmed for the processes needed for calculating the distance to fault and the fault resistance. The calculating unit is also provided with known values such as the impedance of the line. In connection to the occurrence of a fault information regarding the type of fault may be supplied to the calculating unit for choosing the right selection path. When the calculating unit has determined the distance to fault, it is displayed on the device and/or sent to remotely located display means. A printout of the result may also be provided. In addition to signalling the fault distance, the device can produce reports, in which are recorded measured values of the currents of both lines, voltages, type of fault and other associated with a given fault at a distance.

The information in the form of a result for $d_v$ or $d_{v\text{-}comp}$ from the fault location system may also be embodied as a data signal for communication via a network to provide a basis for a control action. The distance $d_v$ or $d_{v\text{-}comp}$ may be sent as a signal for a control action such as: automatic notification to operational network centres of fault and its location or to automatically start calculations to determine journey time to location, which repair crew shall be dispatched to site, possible time taken to execute a repair, calculate which vehicles or crew member may be needed, how many shifts work per crew will be required and the like actions.

The calculating unit may comprise filters for filtering the signals, A/D-converters for converting and sampling the signals and a micro processor. The micro processor comprises a central processing unit CPU performing the following functions: collection of measured values, processing of measured values, calculation of distance to fault and output of result from calculation. The micro processor further comprises a data memory and a program memory.

A computer program for carrying out the method according to the present invention is stored in the program memory. It is to be understood that the computer program may also be run on general purpose computer instead of a specially adapted computer.

The software includes computer program code elements or software code portions that make the computer perform the said method using the equations, algorithms, data and calculations previously described. A part of the program may be stored in a processor as above, but also in a RAM, ROM, PROM or EPROM chip or similar, and may also be run in a distributed fashion. The program in part or in whole may also be stored on, or in, other suitable computer readable medium such as a magnetic disk, CD-ROM or DVD disk, hard disk, magneto-optical memory storage means, in volatile memory, in flash memory, as firmware, or stored on a data server.

It is to be noted that the embodiment of the invention described and shown in the drawings is to be regarded as a non-limiting example of the invention and that the scope of protection is defined by the patent claims.

APPENDIX 1—Derivation of the Quadratic Equation for Positive Sequence Quantities [Formulas: (6)-(6a)]

By computing absolute values of both the sides of (5) one obtains:

$$1 = \frac{|\underline{V}_{B1} - Z_{L1}I_{B1} + dZ_{L1} \cdot I_{B1}|}{|\underline{V}_{A1} - dZ_{L1}I_{A1}|} \tag{5a}$$

or:

$$|V_{B1} - Z_{L1}I_{B1} + dZ_{L1}I_{B1}| = |V_{A1} - dZ_{L1}I_{A1}| \tag{5b}$$

Left-hand side of equation (5b) can be written down as:

$$L = |V_{B1} - Z_{L1}I_{B1} + dZ_{L1}I_{B1}| = |(V_{B1})_{real} + j(V_{B1})_{imag} - (Z_{L1}I_{B1})_{real} - j(Z_{L1}I_{B1})_{imag} + (dZ_{L1}I_{B1})_{real} + j(dZ_{L1}I_{B1})_{imag}| \tag{5c}$$

Continuing determination of the left-hand side of (5b) one obtains:

$$L = |\underline{V}_{B1} - Z_{L1}I_{B1} + dZ_{L1}I_{B1}|$$
$$= \sqrt{((\underline{V}_{B1})_{real} - (Z_{L1}I_{B1})_{real} + (dZ_{L1}I_{B1})_{real})^2 + ((\underline{V}_{B1})_{imag} - (Z_{L1}I_{B1})_{imag} + (dZ_{L1}I_{B1})_{imag})^2} \tag{5d}$$

After rearrangements one obtains:

$$L = \sqrt{(L_1 + L_2 d)^2 + (L_3 + L_4 d)^2} \tag{5e}$$

where:
$L_1 = (V_{B1})_{real} - (Z_{L1}I_{B1})_{real}$
$L_2 = (Z_{L1}I_{B1})_{real}$
$L_3 = (V_{B1})_{imag} - (Z_{L1}I_{B1})_{imag}$
$L_4 = (Z_{L1}I_{B1})_{imag}$ Formula (5e) can also be written as:

$$L = \sqrt{L_5 d^2 + L_6 d + L_7} \tag{5f}$$

where:

$$L_5 = L_2^2 + L_4^2 = \{(Z_{L1}I_{B1})_{real}\}^2 + \{(Z_{L1}I_{B1})_{imag}\}^2$$

$$L_6 = 2L_1L_2 + 2L_3L_4$$
$$= 2\{(\underline{V}_{B1})_{real} - (Z_{L1}I_{B1})_{real}\}\{(Z_{L1}I_{B1})_{real}\} +$$
$$2\{(\underline{V}_{B1})_{imag} - (Z_{L1}I_{B1})_{imag}\}\{(Z_{L1}I_{B1})_{imag}\}$$

$L_7 = L_1^2 + L_3^2 = \{(V_{B1})_{real} - (Z_{L1}I_{B1})_{real}\}^2 + \{(V_{B1})_{imag} - (Z_{L1}I_{B1})_{imag}\}^2$ Right-hand side of equation (5b) can be written down as:

$$R = |V_{A1} - dZ_{L1}I_{A1}| = |(V_{A1})_{real} + j(V_{A1})_{imag} - (dZ_{L1}I_{A1})_{real} - j(dZ_{L1}I_{A1})_{imag}| \tag{5g}$$

Continuing determination of the right-hand side of (5g) one obtains:

$$R = |\underline{V}_{A1} - dZ_{L1}I_{A1}| \tag{5h}$$

$$= \sqrt{\{(\underline{V}_{A1})_{real} + (-dZ_{L1}I_{A1})_{real}\}^2 + \{(\underline{V}_{A1})_{imag} + (-d\underline{Z}_{L1}I_{A1})_{imag}\}^2}$$

After further rearrangements one obtains:

$$R = \sqrt{(R_1 - R_2 d)^2 + (R_3 - R_4 d)^2} \tag{5i}$$

where:
$R_1 = (V_{A1})_{real}$
$R_2 = (Z_{L1}I_{A1})_{real}$
$R_3 = (V_{A1})_{imag}$
$R_4 = (Z_{L1}I_{A1})_{imag}$ Formula (5i) can also be written as:

$$R=\sqrt{R_5 d^2+R_6 d+R_7} \qquad (5j)$$

where:

$$R_5=R_2^2+R_4^2=\{(Z_{L1}I_{A1})_{real}\}^2+\{(Z_{L1}I_{A1})_{imag}\}^2$$

$$R_6 = -2R_1R_2 - 2R_3R_4$$
$$= -2\{(V_{A1})_{real}\}\{(Z_{L1}I_{A1})_{real}\} - 2\{(V_{A1})_{imag}\}\{(Z_{L1}I_{A1})_{imag}\}$$

$$R_7=R_1^2+R_3^2=\{(V_{A1})_{real}\}^2+\{(V_{V1})_{imag}\}^2$$

Taking the results of the above derivations the formula (5b) can be written down as:

$$\sqrt{L_5 d^2+L_6 d+L_7}=\sqrt{R_5 d^2+R_6 d+R_7} \qquad (5k)$$

where:
$L_5$, $L_6$, $L_7$—as in (5f),
$R_5$, $R_6$, $R_7$—as in (5j).

The formula (5k) results in the quadratic algebraic equation for the unknown fault distance (d):

$$A_2 d^2+A_1 d+A_0=0 \qquad (5l)$$

where:

$$A_2=R_5-L_5=\{(Z_{L1}I_{A1})_{real}\}^2+\{(Z_{L1}I_{A1})_{imag}\}^2- \{(Z_{L1}I_{B1})_{real}\}^2-\{(Z_{L1}I_{B1})_{imag}\}^2$$

$$A_1=R_6-L_6=-2\{(V_{A1})_{real}\}\{(Z_{L1}I_{A1})_{real}\}-2\{(V_{A1})_{imag}\} \{(Z_{L1}I_{A1})_{imag}\}-2\{(V_{B1})_{real}-(Z_{L1}I_{B1})_{real}\}\{(Z_{L1}I_{B1})_{real}\}- 2\{(V_{B1})_{imag}-(Z_{L1}I_{B1})_{imag}\}\{(Z_{L1}I_{B1})_{imag}$$

$$A_0 = R_7 - L_7$$
$$= \{(V_{A1})_{real}\}^2 + \{(V_{A1})_{imag}\}^2 - \{(V_{B1})_{real} - (Z_{L1}I_{B1})_{real}\}^2 - \{(V_{B1})_{imag} - (Z_{L1}I_{B1})_{imag}\}^2$$

The coefficients $A_2$, $A_1$, $A_0$ from (5l) can be written down in more compact form by utilizing the following relations, which are valid for any complex numbers:

$$A=A_1+jA_2,\ B=B_1+jB_2:$$

$$\{A_1\}^2+\{A_2\}^2=|A|^2 \qquad (5m)$$

$$\{B_1\}^2+\{B_2\}^2=|B|^2 \qquad (5n)$$

$$\text{real}\{AB^*\}=\text{real}\{(A_1+jA_2)(B_1-jB_2)\}=\text{real}\{(A_1B_1+ A_2B_2)+j(A_2B_1-A_1B_2)\}=A_1B_1+A_2B_2 \qquad (5o)$$

X* denotes conjugate of X
|X| denotes absolute value of X.

Finally, taking into account the above relations for complex numbers (5m)-(5o), the quadratic algebraic equation for the fault distance (d)—formula (5l) transforms to the formula (6).

APPENDIX 2—Derivation of the Formula Determining the Value of the Synchronization Angle ($\delta_m$)·equation (A1_9)

The value of the synchronization angle ($\delta_m$) is calculated from the following condition for the circuit of FIG. 5:

$$I_{Ax}=-I_{Bx} \qquad (A1\_1)$$

where:

$$I_{Ax}=I_{A\_pre\_1}e^{j\delta_m}-j0.5\omega_1 C_1 V_{A\_pre\_1}e^{j\delta_m}$$

$$I_{Bx}=I_{B\_pre\_1}-j0.5\omega_1 C_1 V_{B\_pre\_1}$$

From (A1_1) one obtains:

$$e^{j\delta_m}=\frac{-I_{B\_pre\_1}+j0.5\omega_1 C_1 V_{B\_pre\_1}}{I_{A\_pre\_1}-j0.5\omega_1 C_1 V_{A\_pre\_1}}=P+jQ \qquad (A1\_2)$$

$$\delta_m=\text{angle}(P+jQ)=\tan^{-1}\left(\frac{Q}{P}\right) \qquad (A1\_3)$$

To calculate the coefficients (P, Q) from (A1_2)-(A1_3) one uses the following substitutions:

$$I_{A\_pre\_1}=I_{A1}+jI_{A2} \qquad (A1\_4)$$

$$I_{B\_pre\_1}=I_{B1}+jI_{B2} \qquad (A1\_5)$$

$$V_{A\_pre\_1}=V_{A1}+jV_{A2} \qquad (A1\_6)$$

$$V_{B\_pre\_1}=V_{B1}+jV_{B2} \qquad (A1\_7)$$

Thus, formula (A1_2) takes the form:

$$e^{j\delta_m} = \frac{-(I_{B1}+jI_{B2})+j0.5\omega_1 C_1(V_{B1}+jV_{B2})}{(I_{A1}+jI_{A2})-j0.5\omega_1 C_1(V_{A1}+jV_{A2})} \qquad (A1\_8)$$
$$= \frac{-(I_{B1}-0.5\omega_1 C_1 V_{B2})+j(-I_{B2}+0.5\omega_1 C_1 V_{B1})}{(I_{A1}+0.5\omega_1 C_1 V_{A2})+j(I_{A2}-0.5\omega_1 C_1 V_{A1})}$$
$$= \frac{N_1+jN_2}{D_1+jD_2}$$
$$= \frac{(N_1+jN_2)(D_1-jD_2)}{(D_1+jD_2)(D_1-jD_2)}$$
$$= \frac{(N_1 D_1+N_2 D_2)+j(N_2 D_1-N_1 D_2)}{D_1^2+D_2^2}$$
$$= \frac{N_1 D_1+N_2 D_2}{D_1^2+D_2^2}+j\frac{N_2 D_1-N_1 D_2}{D_1^2+D_2^2}=P+jQ$$

In consequence, the formula (A1_3) for the synchronization angle ($\delta_m$) takes the form:

$$\delta_m=\text{angle}(P+jQ)=\tan^{-1}\left(\frac{Q}{P}\right)=\tan^{-1}\left(\frac{N_2 D_1-N_1 D_2}{N_1 D_1+N_2 D_2}\right) \qquad (A1\_9)$$

where:

$N_1=-I_{B1}-0.5\omega_1 C_1 V_{B2}=-\text{real}(I_{B\_pre\_1})-0.5\omega_1 C_1 \text{imag}(V_{B\_pre\_1})$ $N_2=-I_{B2}+0.5\omega_1 C_1 V_{B1}=-\text{imag}(I_{B\_pre\_1})+0.5\omega_1 C_1 \text{real}(V_{B\_pre\_1})$ $D_1=I_{A1}+0.5\omega_1 C_1 V_{A2}=\text{real}(I_{A\_pre\_1})+0.5\omega_1 C_1 \text{imag}(V_{A\_pre\_1})$ $D_2=I_{A2}-0.5\omega_1 C_1 V_{A1}=\text{imag}(I_{A\_pre\_1})-0.5\omega_1 C_1 \text{real}(V_{A\_pre\_1})$ APPENDIX 3—Derivation of the Formula for Determining the Fault Path Impedance in Case of Three-Phase Balanced Faults [Equations: (9)-(10)]

Taking the left-hand side loop (LHS) in the circuit of FIG. 4 the following voltage formula can be written down:

$$V_{A1}e^{j\delta}-dZ_{L1}I_{A1}e^{j\delta}-Z_F(I_{A1}e^{j\delta}+I_{B1})=0 \qquad (a)$$

Thus, the fault path impedance can be calculated as:

$$Z_F = \frac{\underline{V}_{A1}e^{j\delta} - d\underline{Z}_{L1}\underline{I}_{A1}e^{j\delta}}{\underline{I}_{A1}e^{j\delta} + \underline{I}_{B1}} = \frac{\underline{V}_{A1} - d\underline{Z}_{L1}\underline{I}_{A1}}{\underline{I}_{A1} + \frac{\underline{I}_{B1}}{e^{j\delta}}} = \frac{\underline{V}_{A1} - d\underline{Z}_{L1}\underline{I}_{A1}}{\underline{I}_{A1} + \frac{\underline{I}_{B1}}{\underline{V}_{B1} - \underline{Z}_{L1}\underline{I}_{B1} + d\underline{Z}_{L1}\underline{I}_{B1}}}$$

$$= \frac{\underline{V}_{A1} - d\underline{Z}_{L1}\underline{I}_{A1}}{\underline{I}_{A1} + \frac{\underline{I}_{B1}(\underline{V}_{A1} - d\underline{Z}_{L1}\underline{I}_{A1})}{\underline{V}_{B1} - \underline{Z}_{L1}\underline{I}_{B1} + d\underline{Z}_{L1}\underline{I}_{B1}}} = \frac{\underline{V}_{A1} - d\underline{Z}_{L1}\underline{I}_{A1}}{\frac{\underline{I}_{A1}(\underline{V}_{B1} - \underline{Z}_{L1}\underline{I}_{B1} + d\underline{Z}_{L1}\underline{I}_{B1}) + \underline{I}_{B1}(\underline{V}_{A1} - d\underline{Z}_{L1}\underline{I}_{A1})}{\underline{V}_{B1} - \underline{Z}_{L1}\underline{I}_{B1} + d\underline{Z}_{L1}\underline{I}_{B1}}}$$

$$= \frac{(\underline{V}_{A1} - d\underline{Z}_{L1}\underline{I}_{A1})(\underline{V}_{B1} - \underline{Z}_{L1}\underline{I}_{B1} + d\underline{Z}_{L1}\underline{I}_{B1})}{\underline{I}_{A1}(\underline{V}_{B1} - \underline{Z}_{L1}\underline{I}_{B1} + d\underline{Z}_{L1}\underline{I}_{B1}) + \underline{I}_{B1}(\underline{V}_{A1} - d\underline{Z}_{L1}\underline{I}_{A1})}$$

$$= \frac{-\underline{Z}_{L1}^2 \underline{I}_{A1}\underline{I}_{B1}d^2 + (\underline{Z}_{L1}\underline{I}_{B1}\underline{V}_{A1} - \underline{Z}_{L1}\underline{I}_{A1}\underline{V}_{B1} + \underline{Z}_{L1}^2\underline{I}_{A1}\underline{I}_{B1})d + (\underline{V}_{A1}\underline{V}_{B1} - \underline{Z}_{L1}\underline{I}_{B1}\underline{V}_{A1})}{\underline{I}_{A1}\underline{V}_{B1} + \underline{I}_{B1}\underline{V}_{A1} - \underline{Z}_{L1}\underline{I}_{A1}\underline{I}_{B1}}$$

$$= \frac{-\underline{Z}_{L1}^2 \underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}d^2 + \frac{\underline{Z}_{L1}\underline{I}_{B1}\underline{V}_{A1} - \underline{Z}_{L1}\underline{I}_{A1}\underline{V}_{B1} + \underline{Z}_{L1}^2\underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}d +$$

$$\frac{\underline{V}_{A1}\underline{V}_{B1} - \underline{Z}_{L1}\underline{I}_{B1}\underline{V}_{A1}}{\underline{I}_{A1}\underline{V}_{B1} + \underline{I}_{B1}\underline{V}_{A1} - \underline{Z}_{L1}\underline{I}_{A1}\underline{I}_{B1}}$$

$$= P_2 d^2 + P_1 d + P_0$$

(b)

where:

$$P_2 = \frac{-\underline{Z}_{L1}^2 \underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}$$

$$P_1 = \frac{\underline{Z}_{L1}\underline{I}_{B1}\underline{V}_{A1} - \underline{Z}_{L1}\underline{I}_{A1}\underline{V}_{B1} + \underline{Z}_{L1}^2\underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}$$

$$P_0 = \frac{\underline{V}_{A1}\underline{V}_{B1} - \underline{Z}_{L1}\underline{I}_{B1}\underline{V}_{A1}}{\underline{I}_{A1}\underline{V}_{B1} + \underline{I}_{B1}\underline{V}_{A1} - \underline{Z}_{L1}\underline{I}_{A1}\underline{I}_{B1}}$$

Now, it will be shown that identical formula for the fault path impedance (as in (b)) is obtained when taking the right-hand side loop (RHS) in the circuit of FIG. 4. For this mesh the following voltage formula can be written down:

$$V_{B1} - (1-d)Z_{L1}I_{B1} - Z_F(I_{A1}e^{j\delta} + I_{B1}) = 0 \quad (c)$$

The fault path impedance can be determined from (c) as:

$$Z_F = \frac{\underline{V}_{B1} - (1-d)\underline{Z}_{L1}\underline{I}_{B1}}{\underline{I}_{A1}e^{j\delta} + \underline{I}_{B1}} = \frac{\underline{V}_{B1} - \underline{Z}_{L1}\underline{I}_{B1} + d\underline{Z}_{L1}\underline{I}_{B1}}{\underline{I}_{A1}e^{j\delta} + \underline{I}_{B1}} \quad (d)$$

$$= \frac{\underline{V}_{B1} - \underline{Z}_{L1}\underline{I}_{B1} + d\underline{Z}_{L1}\underline{I}_{B1}}{\underline{I}_{A1}\frac{\underline{V}_{B1} - \underline{Z}_{L1}\underline{I}_{B1} + d\underline{Z}_{L1}\underline{I}_{B1}}{\underline{V}_{A1} - d\underline{Z}_{L1}\underline{I}_{A1}} + \underline{I}_{B1}}$$

$$= \frac{\underline{V}_{B1} - \underline{Z}_{L1}\underline{I}_{B1} + d\underline{Z}_{L1}\underline{I}_{B1}}{\frac{\underline{I}_{A1}(\underline{V}_{B1} - \underline{Z}_{L1}\underline{I}_{B1} + d\underline{Z}_{L1}\underline{I}_{B1})}{\underline{V}_{A1} - d\underline{Z}_{L1}\underline{I}_{A1}} + \frac{\underline{I}_{B1}(\underline{V}_{A1} - d\underline{Z}_{L1}\underline{I}_{A1})}{\underline{V}_{A1} - d\underline{Z}_{L1}\underline{I}_{A1}}}$$

$$= \frac{(\underline{V}_{B1} - \underline{Z}_{L1}\underline{I}_{B1} + d\underline{Z}_{L1}\underline{I}_{B1})(\underline{V}_{A1} - d\underline{Z}_{L1}\underline{I}_{A1})}{\underline{I}_{A1}(\underline{V}_{B1} - \underline{Z}_{L1}\underline{I}_{B1} + d\underline{Z}_{L1}\underline{I}_{B1}) + \underline{I}_{B1}(\underline{V}_{A1} - d\underline{Z}_{L1}\underline{I}_{A1})}$$

$$= \frac{-\underline{Z}_{L1}^2 \underline{I}_{A1}\underline{I}_{B1}d^2 + (\underline{Z}_{L1}\underline{I}_{B1}\underline{V}_{A1} - \underline{Z}_{L1}\underline{I}_{A1}\underline{V}_{B1} + \underline{Z}_{L1}^2\underline{I}_{A1}\underline{I}_{B1})d + (\underline{V}_{A1}\underline{V}_{B1} - \underline{Z}_{L1}\underline{I}_{B1}\underline{V}_{A1})}{\underline{I}_{A1}\underline{V}_{B1} + \underline{I}_{B1}\underline{V}_{A1} - \underline{Z}_{L1}\underline{I}_{A1}\underline{I}_{B1}}$$

$$= \frac{-\underline{Z}_{L1}^2 \underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}d^2 +$$

$$\frac{\underline{Z}_{L1}\underline{I}_{B1}\underline{V}_{A1} - \underline{Z}_{L1}\underline{I}_{A1}\underline{V}_{B1} + \underline{Z}_{L1}^2\underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}d +$$

$$\frac{\underline{V}_{A1}\underline{V}_{B1} - \underline{Z}_{L1}\underline{I}_{B1}\underline{V}_{A1}}{\underline{I}_{A1}\underline{V}_{B1} + \underline{I}_{B1}\underline{V}_{A1} - \underline{Z}_{L1}\underline{I}_{A1}\underline{I}_{B1}}$$

$$= P_2 d^2 + P_1 d + P_0$$

where:

$$P_2 = \frac{-\underline{Z}_{L1}^2 \underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}$$

$$P_1 = \frac{\underline{Z}_{L1}\underline{I}_{B1}\underline{V}_{A1} - \underline{Z}_{L1}\underline{I}_{A1}\underline{V}_{B1} + \underline{Z}_{L1}^2\underline{I}_{A1}\underline{I}_{B1}}{\underline{I}_{A1}\underline{V}_{B1} + \underline{I}_{B1}\underline{V}_{A1} - \underline{Z}_{L1}\underline{I}_{A1}\underline{I}_{B1}}$$

$$P_0 = \frac{\underline{V}_{A1}\underline{V}_{B1} - \underline{Z}_{L1}\underline{I}_{B1}\underline{V}_{A1}}{\underline{I}_{A1}\underline{V}_{B1} + \underline{I}_{B1}\underline{V}_{A1} - \underline{Z}_{L1}\underline{I}_{A1}\underline{I}_{B1}}$$

Thus, impedance of a fault path in case of a three-phase balanced fault is calculated in the same way, regardless from which the substation it is seen.

What is claimed is:

1. Method for fault location in a section of at least one transmission line comprising:
   measuring the voltages and currents at both ends, A and B, of the section,
   obtaining the phasors of the positive sequence voltages $V_{A1}$, $V_{B1}$ measured at the ends A and B, respectively,
   obtaining the phasors of the positive sequence currents $I_{A1}$, $I_{B1}$ measured at the ends A and B, respectively,
   using an equivalent circuit diagram for the positive sequence quantities, thereby obtaining $$V_{A1}e^{j\delta} - V_{B1} + Z_{L1}I_{B1} - dZ_{L1}(I_{A1}e^{j\delta} + I_{B1}) = 0,$$

where
   $Z_{L1}$—impedance of the whole line for the positive sequence, d—unknown distance to fault [pu], counted from the substation A, δ—unknown synchronization angle, characterised in determining the term exp(jδ) expressed by the formula:

$$e^{j\delta} = \frac{\underline{V}_{B1} - Z_{L1}I_{B1} + dZ_{L1}I_{B1}}{\underline{V}_{A1} - dZ_{L1}I_{A1}}$$

calculating absolute values for both sides:

$$A_2 d^2 + A_1 d + A_0 = 0$$

where:

d—unknown fault distance, $$A_2 = |Z_{L1}I_{A1}|^2 - |Z_{L1}I_{B1}|^2$$

$$A_1 = -2\mathrm{real}\{V_{A1}(Z_{L1}I_{A1})^* + (V_{B1} - Z_{L1}I_{B1})(Z_{L1}I_{B1})^*\}$$

$$A_0 = |V_{A1}|^2 - |V_{B1} - Z_{L1}I_{B1}|^2$$

X* denotes conjugate of X, |X| denotes absolute value of X solving the equation, thereby obtaining two solutions for a distance to fault ($d_1$, $d_2$), and comparing $d_1$, $d_2$ according to $$0 < (d_1 \text{ or } d_2) < 1\ pu.$$

2. Method according to claim 1, wherein, if one of $d_1$ or $d_2$ is satisfied, that value is taken as the valid result.

3. Method according to claim 1, wherein, if both $d_1$ and $d_2$ are satisfied, it comprises the further steps of:

determining the values of the synchronization angle corresponding to both the solutions are determined according to:

$$e^{j\delta_1} = \frac{\underline{V}_{B1} - Z_{L1}I_{B1} + d_1 Z_{L1}I_{B1}}{\underline{V}_{A1} - d_1 Z_{L1}I_{A1}}$$

$$e^{j\delta_2} = \frac{\underline{V}_{B1} - Z_{L1}I_{B1} + d_2 Z_{L1}I_{B1}}{\underline{V}_{A1} - d_2 Z_{L1}I_{A1}}$$

assuming a maximum range for the synchronization angle as $$(-\delta_{short} \div \delta_{short}) = (-\pi/2 \div \pi/2)$$

and comparing $d_1$, $d_2$ according to $$-\delta_{short} < (\delta_1 \text{ or } \delta_2) < \delta_{short}.$$

4. Method according to claim 3, wherein, if one of $\delta_1$, $\delta_2$ is satisfied, that value of a distance to fault, $d_1$ or $d_2$, is taken as the valid solution.

5. Method according to claim 1, wherein, if both $\delta_1$ and $\delta_2$ are satisfied, it comprises the further steps of:

calculating the value of the synchronization angle $\delta_m$ from the positive sequence phasors of the pre-fault voltages and currents measured at both ends and by using a circuit admitting shunt branches, according to $$I_{Ax} = -I_{Bx}$$

where:

$$I_{Ax} = I_{A\_pre\_1} e^{j\delta_m} - j0.5\omega_1 C_1 V_{A\_pre\_1} e^{j\delta_m}$$

$$I_{Bx} = I_{B\_pre\_1} - j0.5\omega_1 C_1 V_{B\_pre\_1}$$

leading to $$\delta_m = \mathrm{angle}(P + jQ) = \tan^{-1}\left(\frac{N_2 D_1 - N_1 D_2}{N_1 D_1 + N_2 D_2}\right)$$

where:

$$N_1 = -\mathrm{real}(I_{B\_pre\_1}) - 0.5\omega_1 C_1 \mathrm{imag}(V_{B\_pre\_1})$$

$$N_2 = -\mathrm{imag}(I_{B\_pre\_1}) + 0.5\omega_1 C_1 \mathrm{real}(V_{B\_pre\_1})$$

$$D_1 = \mathrm{real}(I_{A\_pre\_1}) + 0.5\omega_1 C_1 \mathrm{imag}(V_{A\_pre\_1})$$

$$D_2 = \mathrm{imag}(I_{A\_pre\_1}) - 0.5\omega_1 C_1 \mathrm{real}(V_{A\_pre\_1})$$

comparing the value of the synchronization angle $\delta_m$ with the values of the synchronization angle ($\delta_1$, $\delta_2$), calculated as:

$$\delta_1 = \mathrm{angle}\left(\frac{\underline{V}_{B1} - Z_{L1}I_{B1} + d_1 Z_{L1}I_{B1}}{\underline{V}_{A1} - d_1 Z_{L1}I_{A1}}\right) = \mathrm{angle}(P_1 + jQ_1) = \tan^{-1}\left(\frac{Q_1}{P_1}\right) \quad (A1\_10)$$

where:

$$P_1 = \mathrm{real}\left(\frac{\underline{V}_{B1} - Z_{L1}I_{B1} + d_1 Z_{L1}I_{B1}}{\underline{V}_{A1} - d_1 Z_{L1}I_{A1}}\right)$$

$$Q_1 = \mathrm{imag}\left(\frac{\underline{V}_{B1} - Z_{L1}I_{B1} + d_1 Z_{L1}I_{B1}}{\underline{V}_{A1} - d_1 Z_{L1}I_{A1}}\right) \quad (A1\_11)$$

and $$\delta_2 = \mathrm{angle}\left(\frac{\underline{V}_{B1} - Z_{L1}I_{B1} + d_2 Z_{L1}I_{B1}}{\underline{V}_{A1} - d_2 Z_{L1}I_{A1}}\right) = \mathrm{angle}(P_2 + jQ_2) = \tan^{-1}\left(\frac{Q_2}{P_2}\right)$$

where:

$$P_2 = \mathrm{real}\left(\frac{\underline{V}_{B1} - Z_{L1}I_{B1} + d_2 Z_{L1}I_{B1}}{\underline{V}_{A1} - d_2 Z_{L1}I_{A1}}\right)$$

$$Q_2 = \mathrm{imag}\left(\frac{\underline{V}_{B1} - Z_{L1}I_{B1} + d_2 Z_{L1}I_{B1}}{\underline{V}_{A1} - d_2 Z_{L1}I_{A1}}\right)$$

performing the selection of the valid result ($d_v$) from the solutions of the quadratic equation $A_2 d^2 + A_1 d + A_0 = 0$ for the fault distance [($d_1$ or $d_2$)] as:

if $|\delta_2 - \delta_m| > |\delta_1 - \delta_m|$ then $d_v = d_1$ else $d_v = d_2$ end.

6. Method according to claim 5, wherein using the phasors of the particular sound phase voltages and currents measured at both ends and by using a circuit admitting shunt branches, and performing the selection of the valid result ($d_v$) from the solutions of the quadratic equation $A_2d^2+A_1d+A_0=0$ for the fault distance [($d_1$ or $d_2$) as:

if $|\delta_2-\delta_{sound}|>|\delta_1-\delta_{sound}|$ then $d_v=d_1$ else $d_v=d_2$ end.

7. Method according to claim 1, wherein, if both $\delta_1$ and $\delta_2$ are satisfied, it comprises the further steps of:
determining that the fault is a three-phase fault,
estimating the fault path impedances,
determining which of the fault path impedances are closest to the condition $Z_F=R_F.$ selecting the valid result ($d_v$) from the solutions of the quadratic equation $A_2d^2+A_1d+A_0=0$ for the fault distance ($d_1$ or $d_2$) as follows:

if $|\text{imag}(Z_{F1}(d_1))|<|\text{imag}(Z_{F2}(d_2))|$ then $d_v=d_1$ else $d_v=d_2$ end.

8. Method according claim 1, wherein, if both $\delta_1$ and $\delta_2$ are satisfied, it comprises the further steps of:
using an equivalent circuit diagram for the negative sequence for obtaining a quadratic equation for the sought fault distance (d) as:

$$B_2d^2+B_1d+B_0=0 \quad (a)$$

where: $B_2$, $B_1$, $B_0$ are:

$B_2=|Z_{L1}I_{A2}|^2-|Z_{L1}I_{B2}|^2$ $B_1=-2\text{real}\{V_{A2}(Z_{L1}I_{A2})^*+(V_{B2}-Z_{L1}I_{B2})(Z_{L1}I_{B2})^*\}$ $B_0=|V_{A2}|^2-|V_{B2}-Z_{L1}I_{B2}|^2 \quad (b)$ solving equation (a), taking into account equation (b), thereby obtaining the next two solutions for the fault distance ($d_3$, $d_4$):

$$d_3 = \frac{-B_1 - \sqrt{B_1^2 - 4B_2B_0}}{2B_2}$$

$$d_4 = \frac{-B_1 + \sqrt{B_1^2 - 4B_2B_0}}{2B_2}$$

where the solutions, taken out of all four solutions ($d_1$, $d_2$, $d_3$, $d_4$), which coincide ($d_i=d_j$, where: i=1 or 2, j=3 or 4) indicate the valid solution for the fault distance ($d_v$).

9. Method according to claim 1, further comprising compensation of shunt capacitances, comprising the steps of:
performing the compensation for the positive sequence currents according to:

$I_{A1\_comp\_1}=I_{A1}-j0.5\omega_1C_1d_vV_{A1} \quad (14)$ $I_{B1\_comp\_1}=I_{B1}-j0.5\omega_1C_1(1-d_v)V_{B1} \quad (15)$ where:
$d_v$—fault distance (the valid result) obtained without taking into account the shunt capacitances of a line, $C_1$—shunt capacitance of a whole line,
taking the phasors compensated for shunt capacitances and transforming the quadratic algebraic equation for a fault distance before the compensation to the following quadratic algebraic equation for the improved fault distance:

$$A_{2\_comp\_1}d_{comp\_1}^2+A_{1\_comp\_1}d_{comp\_1}+A_{0\_comp\_1}=0 \quad (a)$$

where:
$d_{comp\_1}$—the improved fault distance result (result of the first iteration of the compensation),
$A_{2\_comp\_1}$, $A_{1\_comp\_1}$, $A_{0\_comp\_1}$—coefficients (real numbers) expressed duly with the unsynchronized measurements at the line terminals and with the positive sequence impedance of a line ($Z_{L1}$); using the measurements the original positive sequence phasors of voltages ($V_{A1}$, $V_{B1}$) and the phasors of currents compensated for a line shunt capacitances ($I_{A1\_comp\_1}$, $I_{B1\_comp\_1}$):

$A_{2\_comp\_1}=|Z_{L1}I_{A1\_comp\_1}|^2-|Z_{L1}I_{B1\_comp\_1}|^2$ $A_{1\_comp\_1}=-2\text{real}\{V_{A1}(Z_{L1}I_{A1\_comp\_1})^*+(V_{B1}-Z_{L1}I_{B1\_comp\_1})(Z_{L1}I_{B1\_comp\_1})^*\}$ $A_{0\_comp\_1}=|V_{A1}|^2-|V_{B1}-Z_{L1}I_{B1\_comp\_1}|^2 \quad (b)$ solving equation (a), and taking (b), thereby obtaining the two solutions for the fault distance ($d_{comp\_1A}$, $d_{comp\_1B}$):

$$d_{comp\_1A} = \frac{-A_{1\_comp\_1} - \sqrt{A_{1\_comp\_1}^2 - 4A_{2\_comp\_1}A_{0\_comp\_1}}}{2A_{2\_comp\_1}}$$

$$d_{comp\_1B} = \frac{-A_{1\_comp\_1} + \sqrt{A_{1\_comp\_1}^2 - 4A_{2\_comp\_1}A_{0\_comp\_1}}}{2A_{2\_comp\_1}}$$

obtaining the improved value for the fault distance ($d_{v\_comp\_1}$) as a result of the first iteration of the compensation,
selection of a particular solution according to:
if before the compensation the solution $d_1$ was selected as the valid result ($d_v=d_1$), then $d_{comp\_1A}$ is taken as the valid result after the first iteration of the compensation ($d_{v\_comp\_1}=d_{comp\_1A}$),
if, before the compensation the solution $d_2$ was selected as the valid result ($d_v=d_2$) then $d_{comp\_1B}$ is taken as the valid result after the first iteration of the compensation ($d_{v\_comp\_1}=d_{comp\_1B}$),
continue the iterations until the convergence with the pre-defined margin ($d_{margin}$) is achieved:

$|d_{v\_comp\_1}-d_{v\_comp\_i-1}|<d_{margin}$ where:
the index (i) is the present iteration while the index (i−1) is the preceding iteration.

10. A computer data signal embodied in a data communication comprising information about a characteristic of a transmission line or distribution line, characterised in that said signal is sent by a system for fault location over a communications network and includes information about a distance to a fault calculated according to claim 1, such that upon receipt of said signal a control action may be enabled in respect of said fault.

11. Computer program product comprising computer code means and/or software code portions for making a computer or processor perform the steps of the claim 1.

12. Computer program product according to claim 11, stored on a computer-readable medium.

13. Device for fault location in a section of at least one transmission line comprising:

means for measuring the voltages and currents at both ends, A and B, of the section, means for obtaining the phasors of the positive sequence voltages $V_{A1}$, $V_{B1}$ measured at the ends A and B, respectively, means for obtaining the phasors of the positive sequence currents $I_{A1}$, $I_{B1}$ measured at the ends A and B, respectively, using an equivalent circuit diagram for the positive sequence quantities, thereby obtaining $$V_{A1}e^{j\delta} - V_{B1} + Z_{L1}I_{B1} - dZ_{L1}(I_{A1}e^{j\delta} + I_{B1}) = 0,$$

where $Z_{L1}$—impedance of the whole line for the positive sequence, d—unknown distance to fault [pu], counted from the substation A, δ—unknown synchronization angle, characterised in means for determining the term exp(jδ) expressed by the formula:

$$e^{j\delta} = \frac{\underline{V}_{B1} - Z_{L1}I_{B1} + dZ_{L1}I_{B1}}{\underline{V}_{A1} - dZ_{L1}I_{A1}}$$

means for calculating absolute values for both sides:

$$A_2 d^2 + A_1 d + A_0 = 0$$

where:

d—unknown fault distance, $$A_2 = |Z_{L1}I_{A1}|^2 - |Z_{L1}I_{B1}|^2$$

$$A_1 = -2real\{\underline{V}_{A1}(Z_{L1}I_{A1})^* + (\underline{V}_{B1} - Z_{L1}I_{B1})(Z_{L1}I_{B1})^*\}$$

$$A_0 = |\underline{V}_{A1}|^2 - |\underline{V}_{B1} - Z_{L1}I_{B1}|^2$$

X* denotes conjugate of X, |X| denotes absolute value of X means for solving the equation, thereby obtaining two solutions for a distance to fault ($d_1$, $d_2$), and comparing $d_1$, $d_2$ according to $0 < (d_1 \text{ or } d_2) < 1pu$.

14. Use of a device according to claim 13 to determine the distance to fault in a single transmission line.

15. Use of a device according to claim 13 to determine the distance to fault in parallel mutually coupled transmission line.

16. Use of a device according to claim 13 to determine the distance to fault in a distribution line.

* * * * *